United States Patent
Heng et al.

(10) Patent No.: US 9,231,616 B2
(45) Date of Patent: Jan. 5, 2016

(54) UNIFIED BINARIZATION FOR CABAC/CAVLC ENTROPY CODING

(75) Inventors: Brian Heng, Irvine, CA (US); Ba-Zhong Shen, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 780 days.

(21) Appl. No.: 13/523,818

(22) Filed: Jun. 14, 2012

(65) Prior Publication Data
US 2013/0034148 A1 Feb. 7, 2013

Related U.S. Application Data

(60) Provisional application No. 61/515,819, filed on Aug. 5, 2011.

(51) Int. Cl.
```
H04N 7/12       (2006.01)
H04N 11/02      (2006.01)
H04N 11/04      (2006.01)
H03M 7/40       (2006.01)
H04N 19/91      (2014.01)
H04N 19/13      (2014.01)
H04N 19/156     (2014.01)
```
(52) U.S. Cl.
CPC .............. *H03M 7/4006* (2013.01); *H03M 7/40* (2013.01); *H03M 7/4018* (2013.01); *H04N 19/13* (2014.11); *H04N 19/156* (2014.11); *H04N 19/91* (2014.11)

(58) Field of Classification Search
CPC ............ H04N 19/00121; H04N 19/13; H04N 19/436; H04N 19/91
USPC ........................................ 375/240.02, 240.23
See application file for complete search history.

(56) References Cited

U.S. PATENT DOCUMENTS

2010/0079312 A1* 4/2010 Choo et al. ...................... 341/51

FOREIGN PATENT DOCUMENTS

| EP | 2150061 A1 * | 2/2010 | ........ H04N 7/26 |
|---|---|---|---|
| KR | 20100035955 | 4/2010 | |
| WO | 2008053755 A2 | 5/2008 | |

OTHER PUBLICATIONS

European Patent Office; European Search Report; EP Application No. 12005122.2-2223; Nov. 29, 2012; 10 pgs.

*Primary Examiner* — Andy Rao
*Assistant Examiner* — Jared Walker
(74) *Attorney, Agent, or Firm* — Garlick & Markison; Shayne X. Short

(57) ABSTRACT

Unified binarization for CABAC/CAVLC entropy coding. Scalable entropy coding is implemented in accordance with any desired degree of complexity (e.g., entropy encoding and/or decoding). For example, appropriately implemented context-adaptive variable-length coding (CAVLC) and context-adaptive binary arithmetic coding (CABAC) allow for selective entropy coding in accordance with a number of different degrees of complexity. A given device may operate in accordance with a first level complexity a first time, a second level complexity of the second time, and so on. Appropriate coordination and signaling between an encoder/transmitter device and a decoder/receiver device allows for appropriate coordination along a desired degree of complexity. For example, a variable length binarization module and an arithmetic encoding module may be implemented within an encoder/transmitter device and a corresponding arithmetic decoding module and a variable length bin decoding module may be implemented within a decoder/receiver device allowing for entropy coding along various degrees of complexity.

20 Claims, 24 Drawing Sheets

| mb_qp_delta | CABAC bins | CAVLC bits |
|---|---|---|
| ... | ... | ... |
| −3 | 1111110 | 00111 |
| −2 | 11110 | 00101 |
| −1 | 110 | 011 |
| 0 | 0 | 1 |
| 1 | 10 | 010 |
| 2 | 1110 | 00100 |
| 3 | 111110 | 00110 |
| ... | ... | ... |

• CABAC and CAVLC entropy encoding

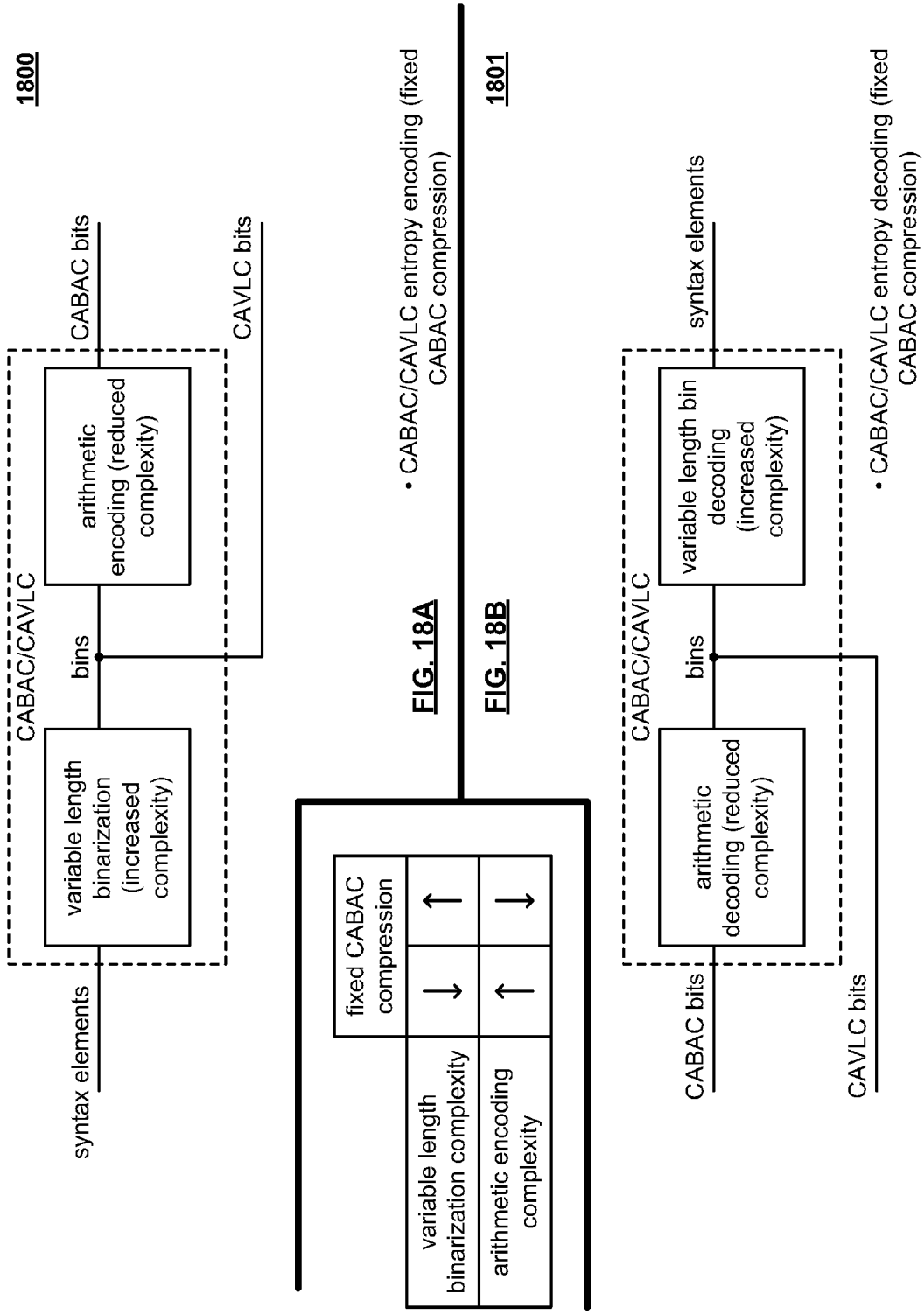

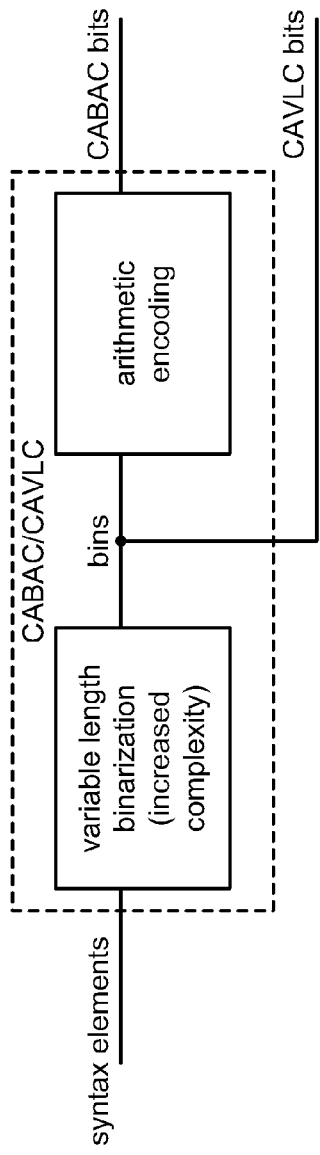
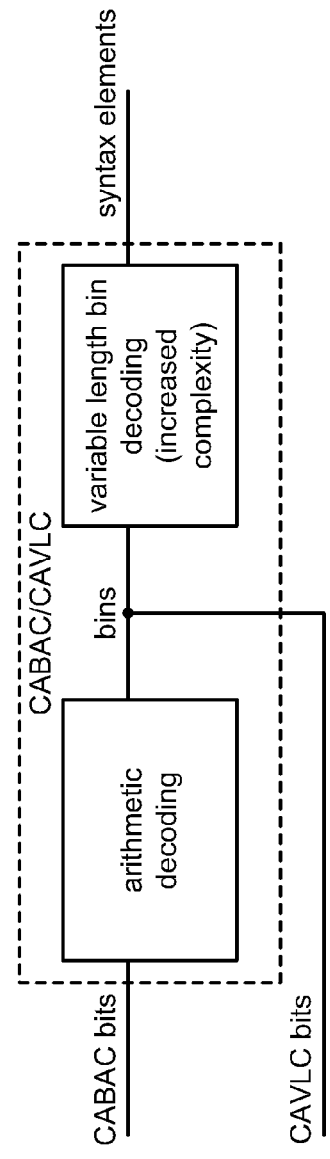
FIG. 19A
FIG. 19B

UNIFIED BINARIZATION FOR CABAC/CAVLC ENTROPY CODING

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Patent Application Ser. No. 61/515,819, entitled "Unified binarization for CABAC/CAVLC entropy coding," filed Aug. 5, 2011.

INCORPORATION BY REFERENCE

The following standards/draft standards are hereby incorporated herein by reference in their entirety and are made part of the present U.S. Utility patent application for all purposes:

1. "High efficiency video coding (HEVC) text specification draft 6," Joint Collaborative Team on Video Coding (JCT-VC) of ITU-T SG16 WP3 and ISO/IEC JTC1/SC29/WG11, 7th Meeting: Geneva, CH, 21-30 Nov. 2011, Document: JCTVC-H1003, 259 pages.

2. International Telecommunication Union, ITU-T, TELECOMMUNICATION STANDARDIZATION SECTOR OF ITU, H.264 (March/2010), SERIES H: AUDIOVISUAL AND MULTIMEDIA SYSTEMS, Infrastructure of audiovisual services—Coding of moving video, Advanced video coding for generic audiovisual services, Recommendation ITU-T H.264, also alternatively referred to as International Telecomm ISO/IEC 14496-10—MPEG-4 Part 10, AVC (Advanced Video Coding), H.264/MPEG-4 Part 10 or AVC (Advanced Video Coding), ITU H.264/MPEG4-AVC, or equivalent.

BACKGROUND OF THE INVENTION

Technical Field of the Invention

The invention relates generally to digital video processing; and, more particularly, it relates to signaling in accordance with such digital video processing.

DESCRIPTION OF RELATED ART

Communication systems that operate to communicate digital media (e.g., images, video, data, etc.) have been under continual development for many years. With respect to such communication systems employing some form of video data, a number of digital images are output or displayed at some frame rate (e.g., frames per second) to effectuate a video signal suitable for output and consumption. Within many such communication systems operating using video data, there can be a trade-off between throughput (e.g., number of image frames that may be transmitted from a first location to a second location) and video and/or image quality of the signal eventually to be output or displayed. The present art does not adequately or acceptably provide a means by which video data may be transmitted from a first location to a second location in accordance with providing an adequate or acceptable video and/or image quality, ensuring a relatively low amount of overhead associated with the communications, relatively low complexity of the communication devices at respective ends of communication links, etc.

BRIEF DESCRIPTION OF THE SEVERAL VIEWS OF THE DRAWINGS

FIG. 11 illustrates an embodiment of a table showing binarization of macroblock quantizer delta syntax elements for context-adaptive binary arithmetic coding (CABAC) and context-adaptive variable-length coding (CAVLC) entropy encoding.

FIG. 18A illustrates an embodiment of a unified architecture for both CABAC and CAVLC entropy encoding, and specifically in which increased complexity variable length binarization is employed, and also specifically in conjunction with reduced complexity arithmetic encoding for CABAC entropy encoding.

FIG. 18B illustrates an embodiment of a unified architecture for both CABAC and CAVLC entropy decoding, and specifically in which increased complexity variable length bin decoding is employed in accordance with CABAC entropy decoding, and also specifically in conjunction with reduced complexity arithmetic decoding for CABAC entropy decoding.

FIG. 19A illustrates an embodiment of a unified architecture for both CABAC and CAVLC entropy encoding, and specifically in which increased complexity variable length binarization is employed.

FIG. 19B illustrates an embodiment of a unified architecture for both CABAC and CAVLC entropy decoding, and specifically in which increased complexity variable length bin decoding is employed in accordance with CABAC entropy decoding.

DETAILED DESCRIPTION OF THE INVENTION

Figure 1:
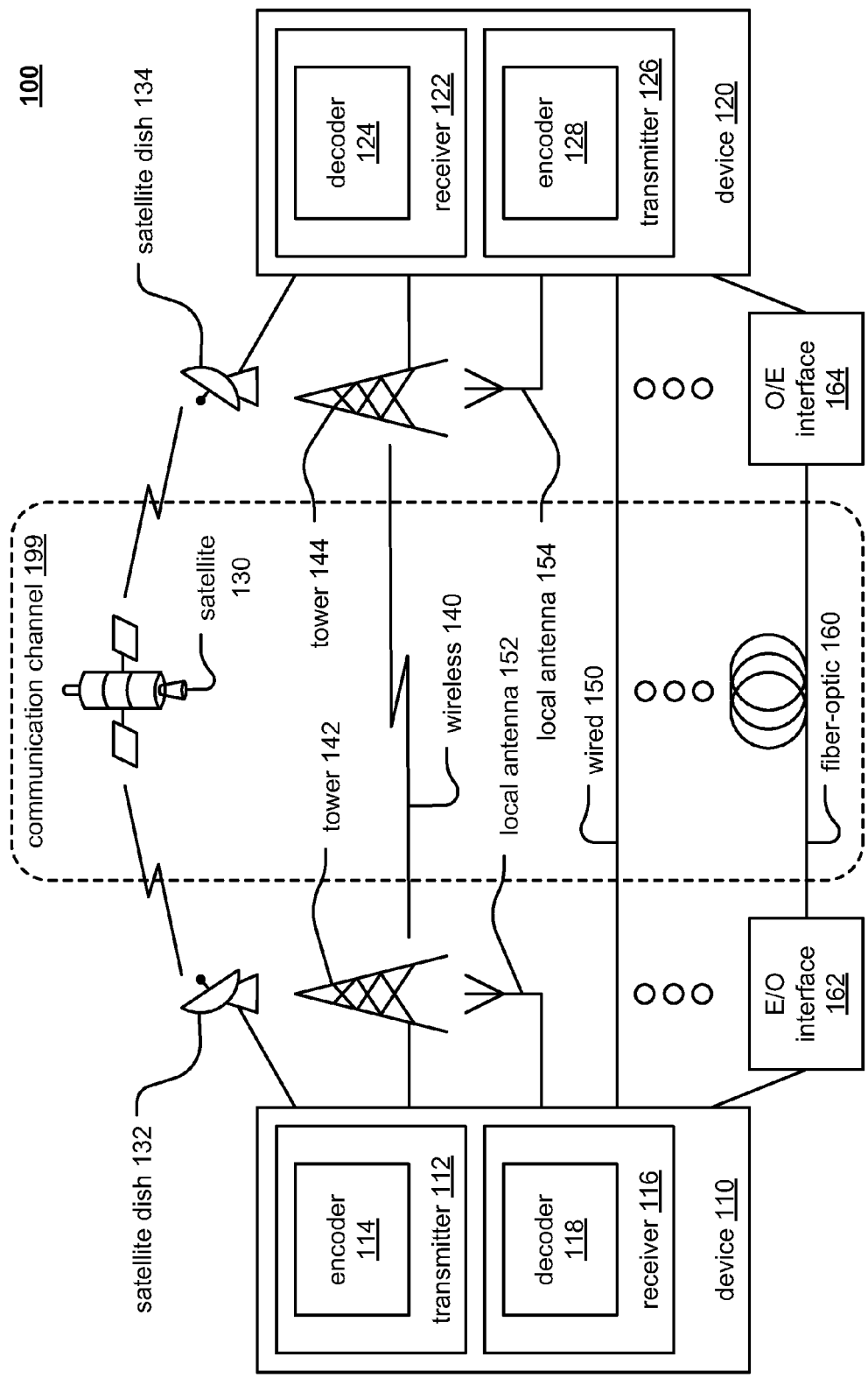
FIG. 1 and FIG. 2 illustrate various embodiments of communication systems.

Within many devices that use digital media such as digital video, respective images thereof, being digital in nature, are represented using pixels. Within certain communication systems, digital media can be transmitted from a first location to a second location at which such media can be output or displayed. The goal of digital communications systems, including those that operate to communicate digital video, is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and/or other types of media as well.

Figure 2:
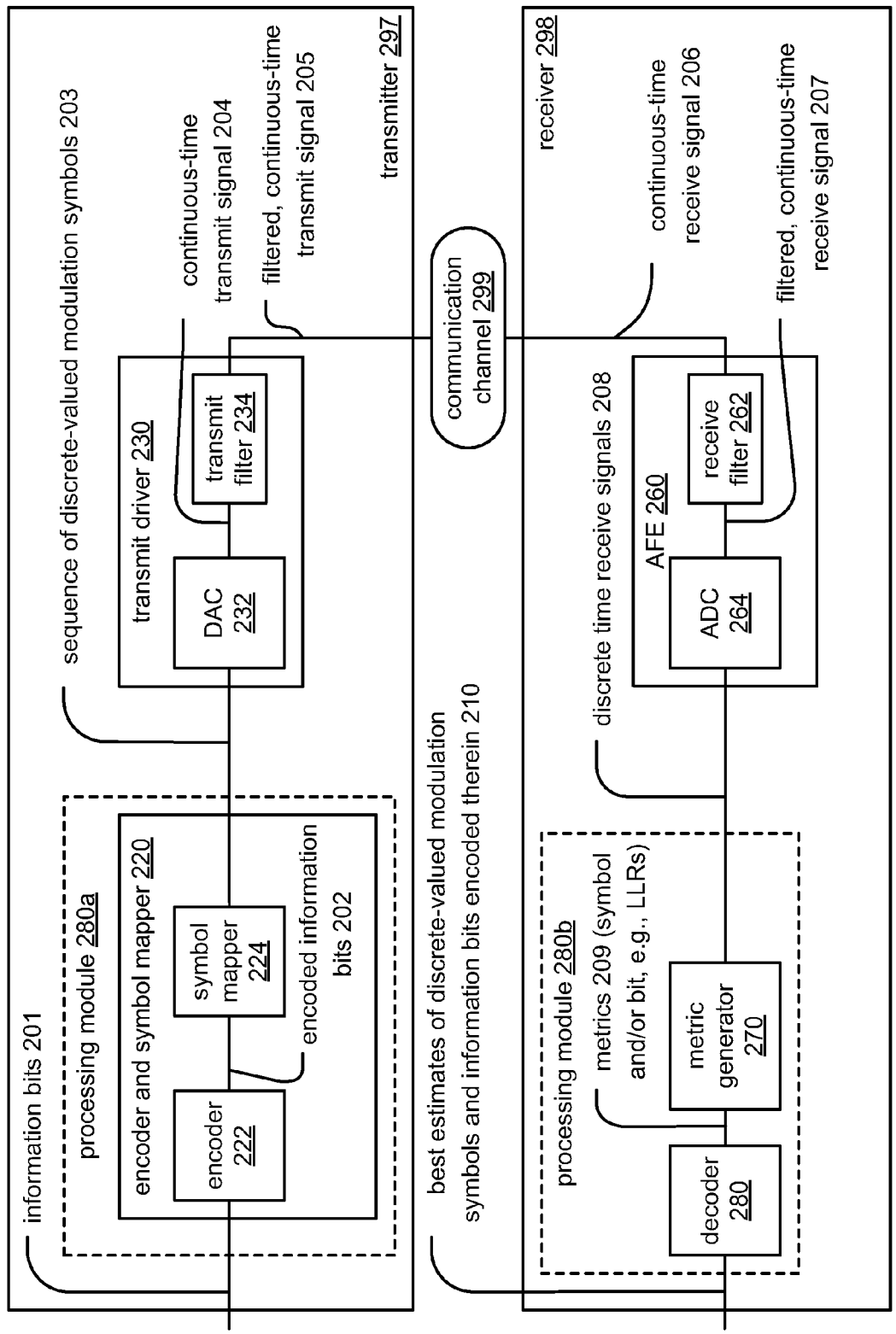

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

It is noted that such communication devices 110 and/or 120 may be stationary or mobile without departing from the scope and spirit of the invention. For example, either one or both of the communication devices 110 and 120 may be implemented in a fixed location or may be a mobile communication device with capability to associate with and/or communicate with more than one network access point (e.g., different respective access points (APs) in the context of a mobile communication system including one or more wireless local area networks (WLANs), different respective satellites in the context of a mobile communication system including one or more satellite, or generally, different respective network access points in the context of a mobile communication system including one or more network access points by which communications may be effectuated with communication devices 110 and/or 120.

To reduce transmission errors that may undesirably be incurred within a communication system, error correction and channel coding schemes are often employed. Generally, these error correction and channel coding schemes involve the use of an encoder at the transmitter end of the communication channel 199 and a decoder at the receiver end of the communication channel 199.

Any of various types of ECC codes described can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Generally speaking, when considering a communication system in which video data is communicated from one location, or subsystem, to another, video data encoding may generally be viewed as being performed at a transmitting end of the communication channel 199, and video data decoding may generally be viewed as being performed at a receiving end of the communication channel 199.

Also, while the embodiment of this diagram shows bi-directional communication being capable between the communication devices 110 and 120, it is of course noted that, in some embodiments, the communication device 110 may include only video data encoding capability, and the communication device 120 may include only video data decoding capability, or vice versa (e.g., in a uni-directional communication embodiment such as in accordance with a video broadcast embodiment).

Referring to the communication system 200 of FIG. 2, at a transmitting end of a communication channel 299, information bits 201 (e.g., corresponding particularly to video data in one embodiment) are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

Within each of the transmitter 297 and the receiver 298, any desired integration of various components, blocks, functional blocks, circuitries, etc. Therein may be implemented. For example, this diagram shows a processing module 280a as including the encoder and symbol mapper 220 and all associated, corresponding components therein, and a processing module 280 is shown as including the metric generator 270 and the decoder 280 and all associated, corresponding components therein. Such processing modules 280a and 280b may be respective integrated circuits. Of course, other boundaries and groupings may alternatively be performed without departing from the scope and spirit of the invention. For example, all components within the transmitter 297 may be included within a first processing module or integrated circuit, and all components within the receiver 298 may be included within a second processing module or integrated circuit. Alternatively, any other combination of components within each of the transmitter 297 and the receiver 298 may be made in other embodiments.

As with the previous embodiment, such a communication system 200 may be employed for the communication of video data is communicated from one location, or subsystem, to another (e.g., from transmitter 297 to the receiver 298 via the communication channel 299).

Digital image and/or video processing of digital images and/or media (including the respective images within a digital video signal) may be performed by any of the various devices depicted below in FIG. 3A-3H to allow a user to view such digital images and/or video. These various devices do not include an exhaustive list of devices in which the image and/or video processing described herein may be effectuated, and it is noted that any generic digital image and/or video processing device may be implemented to perform the processing described herein without departing from the scope and spirit of the invention.

Figure 3:
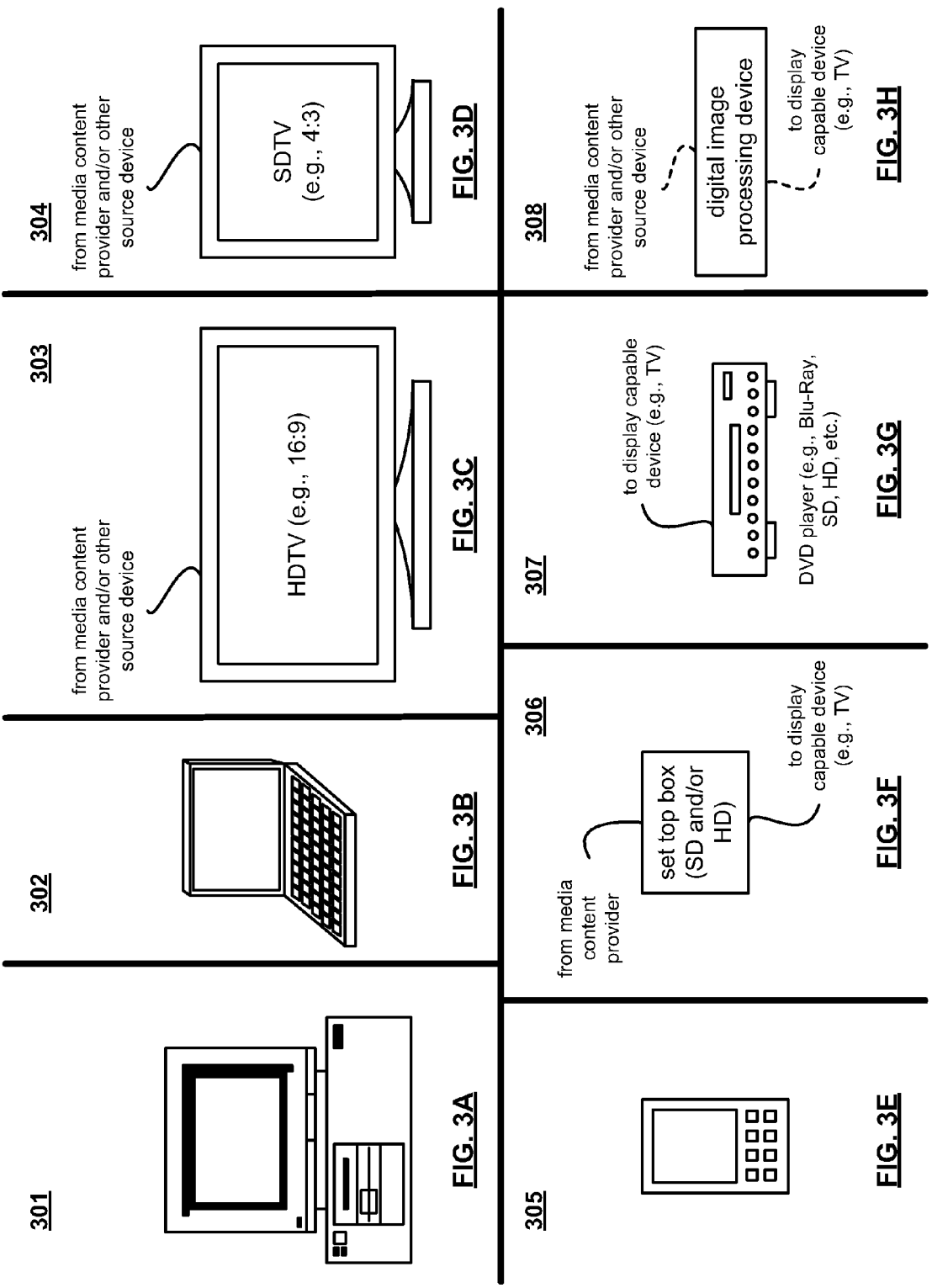
FIG. 3A illustrates an embodiment of a computer.
FIG. 3B illustrates an embodiment of a laptop computer.
FIG. 3C illustrates an embodiment of a high definition (HD) television.
FIG. 3D illustrates an embodiment of a standard definition (SD) television.
FIG. 3E illustrates an embodiment of a handheld media unit.
FIG. 3F illustrates an embodiment of a set top box (STB).
FIG. 3G illustrates an embodiment of a digital video disc (DVD) player.
FIG. 3H illustrates an embodiment of a generic digital image and/or video processing device.

FIG. 3A illustrates an embodiment of a computer 301. The computer 301 can be a desktop computer, or an enterprise storage devices such a server, of a host computer that is attached to a storage array such as a redundant array of independent disks (RAID) array, storage router, edge router, storage switch and/or storage director. A user is able to view still digital images and/or video (e.g., a sequence of digital images) using the computer 301. Oftentimes, various image and/or video viewing programs and/or media player programs are included on a computer 301 to allow a user to view such images (including video).

FIG. 3B illustrates an embodiment of a laptop computer 302. Such a laptop computer 302 may be found and used in any of a wide variety of contexts. In recent years, with the ever-increasing processing capability and functionality found within laptop computers, they are being employed in many instances where previously higher-end and more capable desktop computers would be used. As with the computer 301, the laptop computer 302 may include various image viewing programs and/or media player programs to allow a user to view such images (including video).

FIG. 3C illustrates an embodiment of a high definition (HD) television 303. Many HD televisions 303 include an integrated tuner to allow the receipt, processing, and decoding of media content (e.g., television broadcast signals) thereon. Alternatively, sometimes an HD television 303 receives media content from another source such as a digital video disc (DVD) player, set top box (STB) that receives, processes, and decodes a cable and/or satellite television broadcast signal. Regardless of the particular implementation, the HD television 303 may be implemented to perform image and/or video processing as described herein. Generally speaking, an HD television 303 has capability to display HD media content and oftentimes is implemented having a 16:9 widescreen aspect ratio.

FIG. 3D illustrates an embodiment of a standard definition (SD) television 304. Of course, an SD television 304 is somewhat analogous to an HD television 303, with at least one difference being that the SD television 304 does not include capability to display HD media content, and an SD television 304 oftentimes is implemented having a 4:3 full screen aspect ratio. Nonetheless, even an SD television 304 may be implemented to perform image and/or video processing as described herein.

FIG. 3E illustrates an embodiment of a handheld media unit 305. A handheld media unit 305 may operate to provide general storage or storage of image/video content information such as joint photographic experts group (JPEG) files, tagged image file format (TIFF), bitmap, motion picture experts group (MPEG) files, Windows Media (WMA/WMV) files, other types of video content such as MPEG4 files, etc. for playback to a user, and/or any other type of information that may be stored in a digital format. Historically, such handheld media units were primarily employed for storage and playback of audio media; however, such a handheld media unit 305 may be employed for storage and playback of virtual any media (e.g., audio media, video media, photographic media, etc.). Moreover, such a handheld media unit 305 may also include other functionality such as integrated communication circuitry for wired and wireless communications. Such a handheld media unit 305 may be implemented to perform image and/or video processing as described herein.

FIG. 3F illustrates an embodiment of a set top box (STB) 306. As mentioned above, sometimes a STB 306 may be implemented to receive, process, and decode a cable and/or satellite television broadcast signal to be provided to any appropriate display capable device such as SD television 304 and/or HD television 303. Such an STB 306 may operate independently or cooperatively with such a display capable device to perform image and/or video processing as described herein.

FIG. 3G illustrates an embodiment of a digital video disc (DVD) player 307. Such a DVD player may be a Blu-Ray DVD player, an HD capable DVD player, an SD capable DVD player, an up-sampling capable DVD player (e.g., from SD to HD, etc.) without departing from the scope and spirit of the invention. The DVD player may provide a signal to any appropriate display capable device such as SD television 304 and/or HD television 303. The DVD player 305 may be implemented to perform image and/or video processing as described herein.

FIG. 3H illustrates an embodiment of a generic digital image and/or video processing device 308. Again, as mentioned above, these various devices described above do not include an exhaustive list of devices in which the image and/or video processing described herein may be effectuated, and it is noted that any generic digital image and/or video processing device 308 may be implemented to perform the image and/or video processing described herein without departing from the scope and spirit of the invention.

Figure 4:
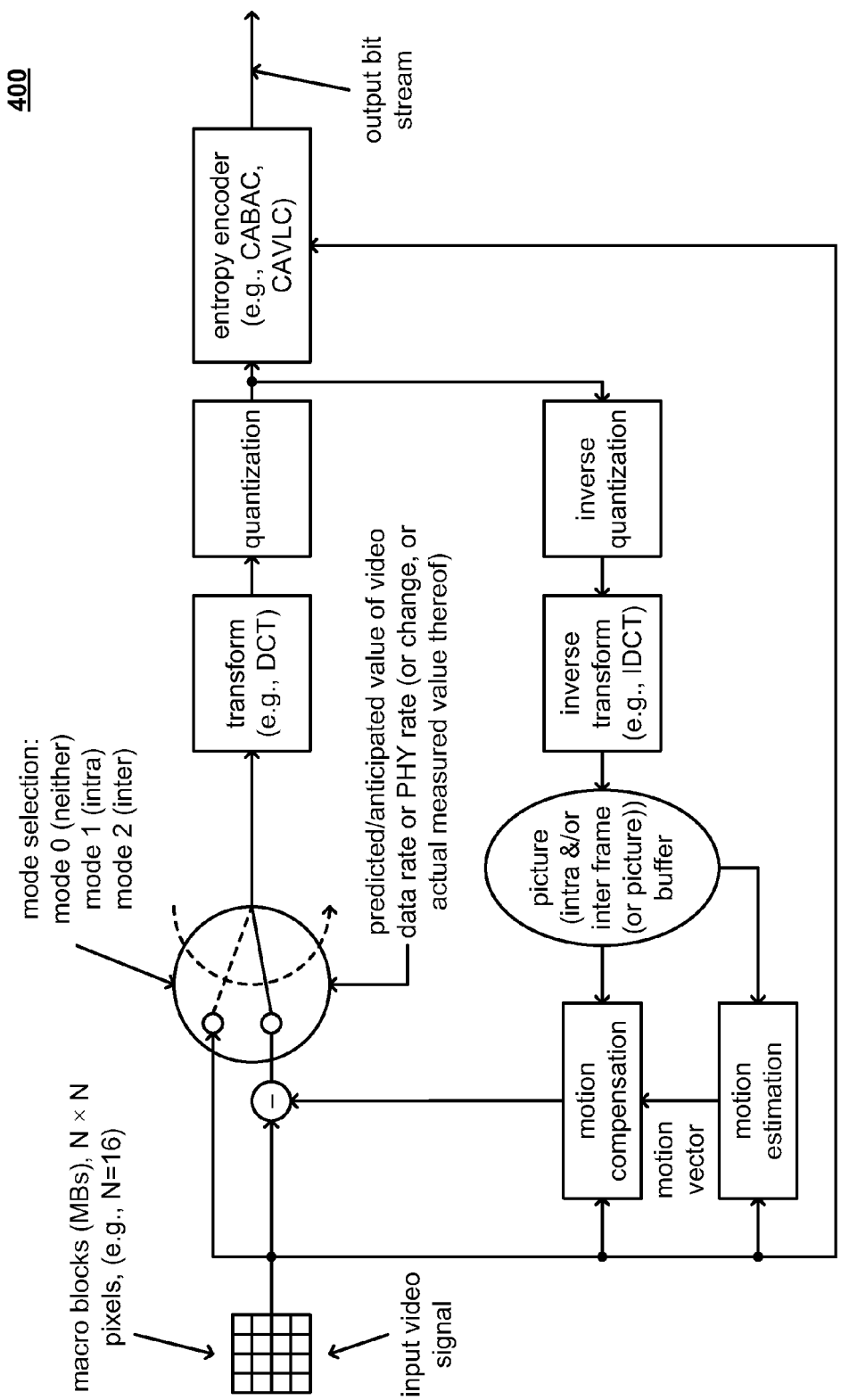
FIG. 4, FIG. 5, and FIG. 6 are diagrams illustrating various embodiments of video encoding architectures.
Figure 5:
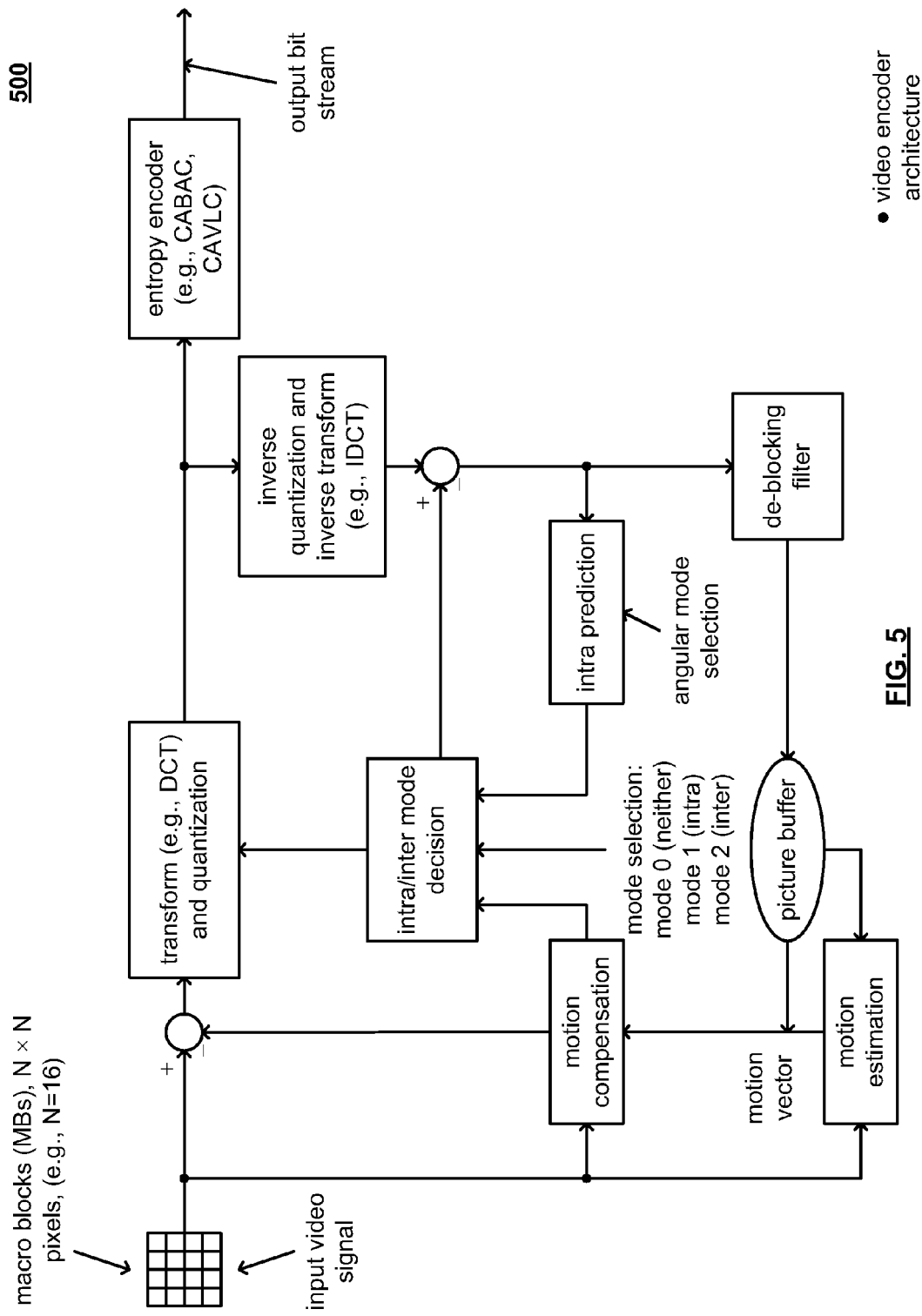
Figure 6:
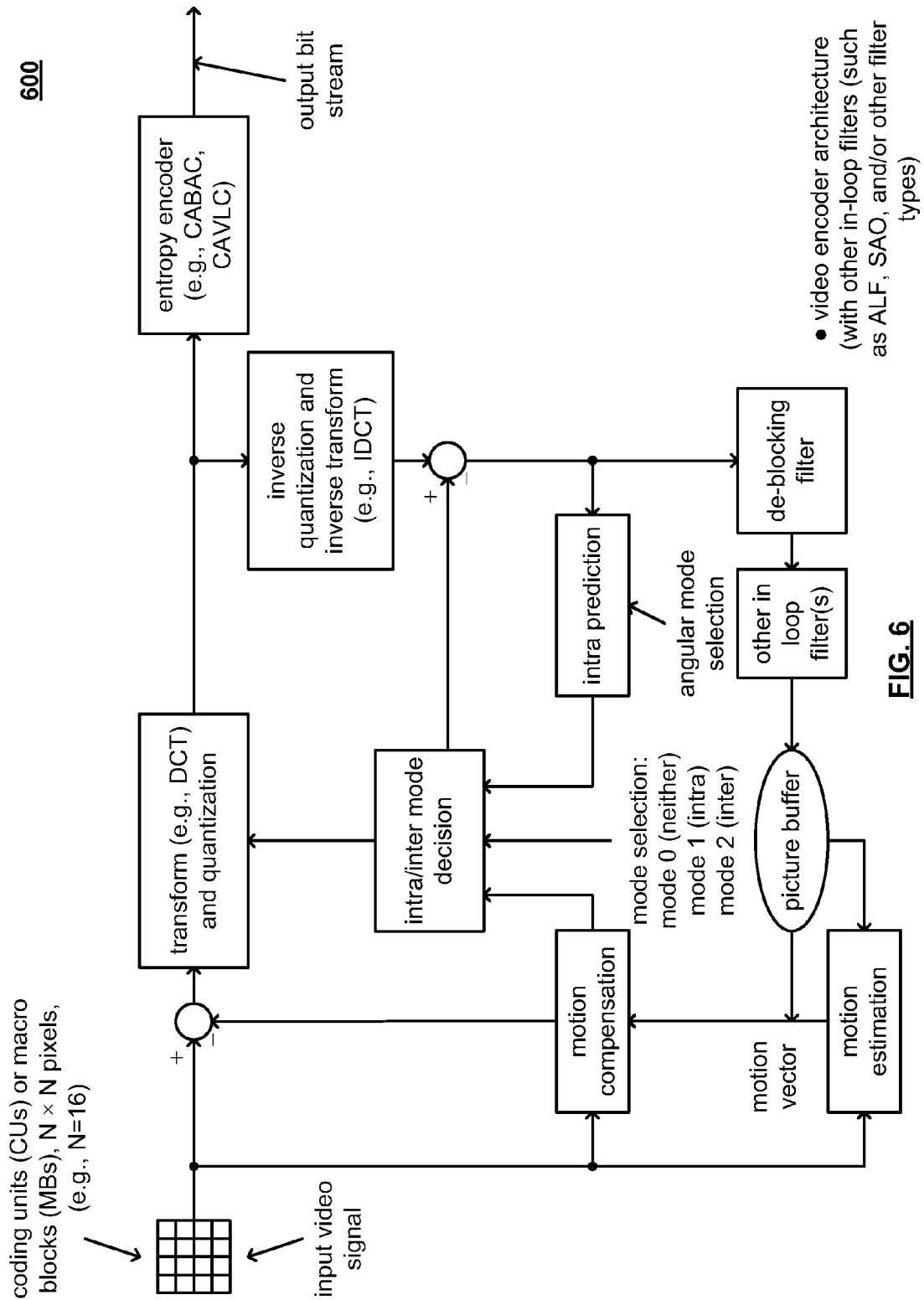

FIG. 4, FIG. 5, and FIG. 6 are diagrams illustrating various embodiments 400 and 500, and 600, respectively, of video encoding architectures.

Referring to embodiment 400 of FIG. 4, as may be seen with respect to this diagram, an input video signal is received by a video encoder. In certain embodiments, the input video signal is composed of coding units (CUs) or macro-blocks (MBs). The size of such coding units or macro-blocks may be varied and can include a number of pixels typically arranged in a square shape. In one embodiment, such coding units or macro-blocks have a size of 16×16 pixels. However, it is generally noted that a macro-block may have any desired size such as N×N pixels, where N is an integer. Of course, some implementations may include non-square shaped coding units or macro-blocks, although square shaped coding units or macro-blocks are employed in a preferred embodiment.

The input video signal may generally be referred to as corresponding to raw frame (or picture) image data. For example, raw frame (or picture) image data may undergo processing to generate luma and chroma samples. In some embodiments, the set of luma samples in a macro-block is of one particular arrangement (e.g., 16×16), and set of the chroma samples is of a different particular arrangement (e.g., 8×8). In accordance with the embodiment depicted herein, a video encoder processes such samples on a block by block basis.

The input video signal then undergoes mode selection by which the input video signal selectively undergoes intra and/or inter-prediction processing. Generally speaking, the input video signal undergoes compression along a compression pathway. When operating with no feedback (e.g., in accordance with neither inter-prediction nor intra-prediction), the input video signal is provided via the compression pathway to undergo transform operations (e.g., in accordance with discrete cosine transform (DCT)). Of course, other transforms may be employed in alternative embodiments. In this mode of operation, the input video signal itself is that which is compressed. The compression pathway may take advantage of the lack of high frequency sensitivity of human eyes in performing the compression.

However, feedback may be employed along the compression pathway by selectively using inter- or intra-prediction video encoding. In accordance with a feedback or predictive mode of operation, the compression pathway operates on a (relatively low energy) residual (e.g., a difference) resulting from subtraction of a predicted value of a current macro-block from the current macro-block. Depending upon which form of prediction is employed in a given instance, a residual or difference between a current macro-block and a predicted value of that macro-block based on at least a portion of that same frame (or picture) or on at least a portion of at least one other frame (or picture) is generated.

The resulting modified video signal then undergoes transform operations along the compression pathway. In one embodiment, a discrete cosine transform (DCT) operates on a set of video samples (e.g., luma, chroma, residual, etc.) to compute respective coefficient values for each of a predetermined number of basis patterns. For example, one embodiment includes 64 basis functions (e.g., such as for an 8×8 sample). Generally speaking, different embodiments may employ different numbers of basis functions (e.g., different transforms). Any combination of those respective basis functions, including appropriate and selective weighting thereof, may be used to represent a given set of video samples. Additional details related to various ways of performing transform operations are described in the technical literature associated with video encoding including those standards/draft standards that have been incorporated by reference as indicated above. The output from the transform processing includes such respective coefficient values. This output is provided to a quantizer.

Generally, most image blocks will typically yield coefficients (e.g., DCT coefficients in an embodiment operating in accordance with discrete cosine transform (DCT)) such that the most relevant DCT coefficients are of lower frequencies. Because of this and of the human eyes' relatively poor sensitivity to high frequency visual effects, a quantizer may be operable to convert most of the less relevant coefficients to a value of zero. That is to say, those coefficients whose relative contribution is below some predetermined value (e.g., some threshold) may be eliminated in accordance with the quantization process. A quantizer may also be operable to convert the significant coefficients into values that can be coded more efficiently than those that result from the transform process. For example, the quantization process may operate by dividing each respective coefficient by an integer value and discarding any remainder. Such a process, when operating on typical coding units or macro-blocks, typically yields a relatively low number of non-zero coefficients which are then delivered to an entropy encoder for lossless encoding and for use in accordance with a feedback path which may select intra-prediction and/or inter-prediction processing in accordance with video encoding.

An entropy encoder operates in accordance with a lossless compression encoding process. In comparison, the quantization operations are generally lossy. The entropy encoding process operates on the coefficients provided from the quantization process. Those coefficients may represent various characteristics (e.g., luma, chroma, residual, etc.). Various types of encoding may be employed by an entropy encoder. For example, context-adaptive binary arithmetic coding (CABAC) and/or context-adaptive variable-length coding (CAVLC) may be performed by the entropy encoder. For example, in accordance with at least one part of an entropy coding scheme, the data is converted to a (run, level) pairing (e.g., data 14, 3, 0, 4, 0, 0, −3 would be converted to the respective (run, level) pairs of (0, 14), (0, 3), (1, 4), (2,−3)). In advance, a table may be prepared that assigns variable length codes for value pairs, such that relatively shorter length codes are assigned to relatively common value pairs, and relatively longer length codes are assigned for relatively less common value pairs.

As the reader will understand, the operations of inverse quantization and inverse transform correspond to those of quantization and transform, respectively. For example, in an embodiment in which a DCT is employed within the transform operations, then an inverse DCT (IDCT) is that employed within the inverse transform operations.

A picture buffer, alternatively referred to as a digital picture buffer or a DPB, receives the signal from the IDCT module; the picture buffer is operative to store the current frame (or picture) and/or one or more other frames (or pictures) such as may be used in accordance with intra-prediction and/or inter-prediction operations as may be performed in accordance with video encoding. It is noted that in accordance with intra-prediction, a relatively small amount of storage may be sufficient, in that, it may not be necessary to store the current frame (or picture) or any other frame (or picture) within the frame (or picture) sequence. Such stored information may be employed for performing motion compensation and/or motion estimation in the case of performing inter-prediction in accordance with video encoding.

In one possible embodiment, for motion estimation, a respective set of luma samples (e.g., 16×16) from a current frame (or picture) are compared to respective buffered counterparts in other frames (or pictures) within the frame (or picture) sequence (e.g., in accordance with inter-prediction). In one possible implementation, a closest matching area is located (e.g., prediction reference) and a vector offset (e.g., motion vector) is produced. In a single frame (or picture), a number of motion vectors may be found and not all will necessarily point in the same direction. One or more operations as performed in accordance with motion estimation are operative to generate one or more motion vectors.

Motion compensation is operative to employ one or more motion vectors as may be generated in accordance with motion estimation. A prediction reference set of samples is identified and delivered for subtraction from the original input video signal in an effort hopefully to yield a relatively (e.g., ideally, much) lower energy residual. If such operations do not result in a yielded lower energy residual, motion compensation need not necessarily be performed and the transform operations may merely operate on the original input video signal instead of on a residual (e.g., in accordance with an operational mode in which the input video signal is provided straight through to the transform operation, such that neither intra-prediction nor inter-prediction are performed), or intra-prediction may be utilized and transform operations performed on the residual resulting from intra-prediction. Also, if the motion estimation and/or motion compensation operations are successful, the motion vector may also be sent to the entropy encoder along with the corresponding residual's coefficients for use in undergoing lossless entropy encoding.

The output from the overall video encoding operation is an output bit stream. It is noted that such an output bit stream may of course undergo certain processing in accordance with generating a continuous time signal which may be transmitted via a communication channel. For example, certain embodiments operate within wireless communication systems. In such an instance, an output bitstream may undergo appropriate digital to analog conversion, frequency conversion, scaling, filtering, modulation, symbol mapping, and/or any other operations within a wireless communication device that operate to generate a continuous time signal capable of being transmitted via a communication channel, etc.

Referring to embodiment 500 of FIG. 5, as may be seen with respect to this diagram, an input video signal is received by a video encoder. In certain embodiments, the input video signal is composed of coding units or macro-blocks (and/or may be partitioned into coding units (CUs)). The size of such coding units or macro-blocks may be varied and can include a number of pixels typically arranged in a square shape. In one embodiment, such coding units or macro-blocks have a size of 16×16 pixels. However, it is generally noted that a macro-block may have any desired size such as N×N pixels, where N is an integer. Of course, some implementations may include non-square shaped coding units or macro-blocks, although square shaped coding units or macro-blocks are employed in a preferred embodiment.

The input video signal may generally be referred to as corresponding to raw frame (or picture) image data. For example, raw frame (or picture) image data may undergo processing to generate luma and chroma samples. In some embodiments, the set of luma samples in a macro-block is of one particular arrangement (e.g., 16×16), and set of the chroma samples is of a different particular arrangement (e.g., 8×8). In accordance with the embodiment depicted herein, a video encoder processes such samples on a block by block basis.

The input video signal then undergoes mode selection by which the input video signal selectively undergoes intra and/or inter-prediction processing. Generally speaking, the input video signal undergoes compression along a compression pathway. When operating with no feedback (e.g., in accordance with neither inter-prediction nor intra-prediction), the input video signal is provided via the compression pathway to undergo transform operations (e.g., in accordance with discrete cosine transform (DCT)). Of course, other transforms may be employed in alternative embodiments. In this mode of operation, the input video signal itself is that which is compressed. The compression pathway may take advantage of the lack of high frequency sensitivity of human eyes in performing the compression.

However, feedback may be employed along the compression pathway by selectively using inter- or intra-prediction video encoding. In accordance with a feedback or predictive mode of operation, the compression pathway operates on a (relatively low energy) residual (e.g., a difference) resulting from subtraction of a predicted value of a current macro-block from the current macro-block. Depending upon which form of prediction is employed in a given instance, a residual or difference between a current macro-block and a predicted value of that macro-block based on at least a portion of that same frame (or picture) or on at least a portion of at least one other frame (or picture) is generated.

The resulting modified video signal then undergoes transform operations along the compression pathway. In one embodiment, a discrete cosine transform (DCT) operates on a set of video samples (e.g., luma, chroma, residual, etc.) to compute respective coefficient values for each of a predetermined number of basis patterns. For example, one embodiment includes 64 basis functions (e.g., such as for an 8×8 sample). Generally speaking, different embodiments may employ different numbers of basis functions (e.g., different transforms). Any combination of those respective basis functions, including appropriate and selective weighting thereof, may be used to represent a given set of video samples. Additional details related to various ways of performing transform operations are described in the technical literature associated with video encoding including those standards/draft standards that have been incorporated by reference as indicated above. The output from the transform processing includes such respective coefficient values. This output is provided to a quantizer.

Generally, most image blocks will typically yield coefficients (e.g., DCT coefficients in an embodiment operating in accordance with discrete cosine transform (DCT)) such that the most relevant DCT coefficients are of lower frequencies. Because of this and of the human eyes' relatively poor sensitivity to high frequency visual effects, a quantizer may be operable to convert most of the less relevant coefficients to a value of zero. That is to say, those coefficients whose relative contribution is below some predetermined value (e.g., some threshold) may be eliminated in accordance with the quantization process. A quantizer may also be operable to convert the significant coefficients into values that can be coded more efficiently than those that result from the transform process. For example, the quantization process may operate by dividing each respective coefficient by an integer value and discarding any remainder. Such a process, when operating on typical coding units or macro-blocks, typically yields a relatively low number of non-zero coefficients which are then delivered to an entropy encoder for lossless encoding and for use in accordance with a feedback path which may select intra-prediction and/or inter-prediction processing in accordance with video encoding.

An entropy encoder operates in accordance with a lossless compression encoding process. In comparison, the quantization operations are generally lossy. The entropy encoding process operates on the coefficients provided from the quantization process. Those coefficients may represent various characteristics (e.g., luma, chroma, residual, etc.). Various types of encoding may be employed by an entropy encoder. For example, context-adaptive binary arithmetic coding (CABAC) and/or context-adaptive variable-length coding (CAVLC) may be performed by the entropy encoder. For example, in accordance with at least one part of an entropy coding scheme, the data is converted to a (run, level) pairing (e.g., data 14, 3, 0, 4, 0, 0, −3 would be converted to the respective (run, level) pairs of (0, 14), (0, 3), (1, 4), (2,−3)). In advance, a table may be prepared that assigns variable length codes for value pairs, such that relatively shorter length codes are assigned to relatively common value pairs, and relatively longer length codes are assigned for relatively less common value pairs.

As the reader will understand, the operations of inverse quantization and inverse transform correspond to those of quantization and transform, respectively. For example, in an embodiment in which a DCT is employed within the transform operations, then an inverse DCT (IDCT) is that employed within the inverse transform operations.

In certain optional embodiments, the output from the de-blocking filter is provided to one or more other in-loop filters (e.g., implemented in accordance with sample adaptive offset (SAO) filter, adaptive loop filter (ALF), and/or any other filter type) implemented to process the output from the inverse transform block.

For example, such an adaptive loop filter (ALF) may be implemented to process the output from the de-blocking filter, or alternatively such an ALF may be implemented to process the output from a sample adaptive offset (SAO) filter that firstly receives the output from the de-blocking filter. Such an adaptive loop filter (ALF) is applied to the decoded picture before it is stored in a picture buffer (sometimes referred to as a DPB, digital picture buffer). The adaptive loop filter (ALF) is implemented to reduce coding noise of the decoded picture, and the filtering thereof may be selectively applied on a slice by slice basis, respectively, for luminance and chrominance whether or not the adaptive loop filter (ALF) is applied either at slice level or at block level. Two-dimensional 2-D finite impulse response (FIR) filtering may be used in application of the adaptive loop filter (ALF). The coefficients of the filters may be designed slice by slice at the encoder, and such information is then signaled to the decoder (e.g., signaled from a transmitter communication device including a video encoder [alternatively referred to as encoder] to a receiver communication device including a video decoder [alternatively referred to as decoder]).

One embodiment operates by generating the coefficients in accordance with Wiener filtering design. In addition, it may be applied on a block by block based at the encoder whether the filtering is performed and such a decision is then signaled to the decoder (e.g., signaled from a transmitter communication device including a video encoder [alternatively referred to as encoder] to a receiver communication device including a video decoder [alternatively referred to as decoder]) based on quadtree structure, where the block size is decided according to the rate-distortion optimization. It is noted that the implementation of using such 2-D filtering may introduce a degree of complexity in accordance with both encoding and decoding. For example, by using 2-D filtering in accordance and implementation of an adaptive loop filter (ALF), there may be some increasing complexity within an encoder implemented within the transmitter communication device as well as within a decoder implemented within a receiver communication device.

With respect to one type of an in-loop filter, the use of an adaptive loop filter (ALF) can provide any of a number of improvements in accordance with such video processing, including an improvement on the objective quality measure by the peak to signal noise ratio (PSNR) that comes from performing random quantization noise removal. In addition, the subjective quality of a subsequently encoded video signal may be achieved from illumination compensation, which may be introduced in accordance with performing offset processing and scaling processing (e.g., in accordance with finite impulse response (FIR) filtering applying a gain) in accordance with adaptive loop filter (ALF) processing.

Receiving the signal output from the ALF is a picture buffer, alternatively referred to as a digital picture buffer or a DPB; the picture buffer is operative to store the current frame (or picture) and/or one or more other frames (or pictures) such as may be used in accordance with intra-prediction and/or inter-prediction operations as may be performed in accordance with video encoding. It is noted that in accordance with intra-prediction, a relatively small amount of storage may be sufficient, in that, it may not be necessary to store the current frame (or picture) or any other frame (or picture) within the frame (or picture) sequence. Such stored information may be employed for performing motion compensation and/or motion estimation in the case of performing inter-prediction in accordance with video encoding.

In one possible embodiment, for motion estimation, a respective set of luma samples (e.g., 16×16) from a current frame (or picture) are compared to respective buffered counterparts in other frames (or pictures) within the frame (or picture) sequence (e.g., in accordance with inter-prediction). In one possible implementation, a closest matching area is located (e.g., prediction reference) and a vector offset (e.g., motion vector) is produced. In a single frame (or picture), a number of motion vectors may be found and not all will necessarily point in the same direction. One or more operations as performed in accordance with motion estimation are operative to generate one or more motion vectors.

Motion compensation is operative to employ one or more motion vectors as may be generated in accordance with motion estimation. A prediction reference set of samples is identified and delivered for subtraction from the original input video signal in an effort hopefully to yield a relatively (e.g., ideally, much) lower energy residual. If such operations do not result in a yielded lower energy residual, motion compensation need not necessarily be performed and the transform operations may merely operate on the original input video signal instead of on a residual (e.g., in accordance with an operational mode in which the input video signal is provided straight through to the transform operation, such that neither intra-prediction nor inter-prediction are performed), or intra-prediction may be utilized and transform operations performed on the residual resulting from intra-prediction. Also, if the motion estimation and/or motion compensation operations are successful, the motion vector may also be sent to the entropy encoder along with the corresponding residual's coefficients for use in undergoing lossless entropy encoding.

The output from the overall video encoding operation is an output bit stream. It is noted that such an output bit stream may of course undergo certain processing in accordance with generating a continuous time signal which may be transmitted via a communication channel. For example, certain embodiments operate within wireless communication systems. In such an instance, an output bitstream may undergo appropriate digital to analog conversion, frequency conversion, scaling, filtering, modulation, symbol mapping, and/or any other operations within a wireless communication device that operate to generate a continuous time signal capable of being transmitted via a communication channel, etc.

Referring to embodiment 600 of FIG. 6, with respect to this diagram depicting an alternative embodiment of a video encoder, such a video encoder carries out prediction, transform, and encoding processes to produce a compressed output bit stream. Such a video encoder may operate in accordance with and be compliant with one or more video encoding protocols, standards, and/or recommended practices such as ISO/IEC 14496-10—MPEG-4 Part 10, AVC (Advanced Video Coding), alternatively referred to as H.264/MPEG-4 Part 10 or AVC (Advanced Video Coding), ITU H.264/MPEG4-AVC.

It is noted that a corresponding video decoder, such as located within a device at another end of a communication channel, is operative to perform the complementary processes of decoding, inverse transform, and reconstruction to produce a respective decoded video sequence that is (ideally) representative of the input video signal.

As may be seen with respect to this diagram, alternative arrangements and architectures may be employed for effectuating video encoding. Generally speaking, an encoder processes an input video signal (e.g., typically composed in units of coding units or macro-blocks, often times being square in shape and including N×N pixels therein). The video encoding determines a prediction of the current macro-block based on previously coded data. That previously coded data may come from the current frame (or picture) itself (e.g., such as in accordance with intra-prediction) or from one or more other frames (or pictures) that have already been coded (e.g., such as in accordance with inter-prediction). The video encoder subtracts the prediction of the current macro-block to form a residual.

Generally speaking, intra-prediction is operative to employ block sizes of one or more particular sizes (e.g., 16×16, 8×8, or 4×4) to predict a current macro-block from surrounding, previously coded pixels within the same frame (or picture). Generally speaking, inter-prediction is operative to employ a range of block sizes (e.g., 16×16 down to 4×4) to predict pixels in the current frame (or picture) from regions that are selected from within one or more previously coded frames (or pictures).

With respect to the transform and quantization operations, a block of residual samples may undergo transformation using a particular transform (e.g., 4×4 or 8×8). One possible embodiment of such a transform operates in accordance with discrete cosine transform (DCT). The transform operation outputs a group of coefficients such that each respective coefficient corresponds to a respective weighting value of one or more basis functions associated with a transform. After undergoing transformation, a block of transform coefficients is quantized (e.g., each respective coefficient may be divided by an integer value and any associated remainder may be discarded, or they may be multiplied by an integer value). The quantization process is generally inherently lossy, and it can reduce the precision of the transform coefficients according to a quantization parameter (QP). Typically, many of the coefficients associated with a given macro-block are zero, and only some nonzero coefficients remain. Generally, a relatively high QP setting is operative to result in a greater proportion of zero-valued coefficients and smaller magnitudes of non-zero coefficients, resulting in relatively high compression (e.g., relatively lower coded bit rate) at the expense of relatively poorly decoded image quality; a relatively low QP setting is operative to allow more nonzero coefficients to remain after quantization and larger magnitudes of non-zero coefficients, resulting in relatively lower compression (e.g., relatively higher coded bit rate) with relatively better decoded image quality.

The video encoding process produces a number of values that are encoded to form the compressed bit stream. Examples of such values include the quantized transform coefficients, information to be employed by a decoder to re-create the appropriate prediction, information regarding the structure of the compressed data and compression tools employed during encoding, information regarding a complete video sequence, etc. Such values and/or parameters (e.g., syntax elements) may undergo encoding within an entropy encoder operating in accordance with CABAC, CAVLC, or some other entropy coding scheme, to produce an output bit stream that may be stored, transmitted (e.g., after undergoing appropriate processing to generate a continuous time signal that comports with a communication channel), etc.

In an embodiment operating using a feedback path, the output of the transform and quantization undergoes inverse quantization and inverse transform. One or both of intra-prediction and inter-prediction may be performed in accordance with video encoding. Also, motion compensation and/or motion estimation may be performed in accordance with such video encoding.

The signal path output from the inverse quantization and inverse transform (e.g., IDCT) block, which is provided to the intra-prediction block, is also provided to a de-blocking filter. The output from the de-blocking filter is provided to one or more other in-loop filters (e.g., implemented in accordance with sample adaptive offset (SAO) filter, adaptive loop filter (ALF), and/or any other filter type) implemented to process the output from the inverse transform block. For example, in one possible embodiment, an ALF is applied to the decoded picture before it is stored in a picture buffer (again, sometimes alternatively referred to as a DPB, digital picture buffer). The ALF is implemented to reduce coding noise of the decoded picture, and the filtering thereof may be selectively applied on a slice by slice basis, respectively, for luminance and chrominance whether or not the ALF is applied either at slice level or at block level. Two-dimensional 2-D finite impulse response (FIR) filtering may be used in application of the ALF. The coefficients of the filters may be designed slice by slice at the encoder, and such information is then signaled to the decoder (e.g., signaled from a transmitter communication device including a video encoder [alternatively referred to as encoder] to a receiver communication device including a video decoder [alternatively referred to as decoder]).

One embodiment generates the coefficients in accordance with Wiener filtering design. In addition, it may be applied on a block by block based at the encoder whether the filtering is performed and such a decision is then signaled to the decoder (e.g., signaled from a transmitter communication device including a video encoder [alternatively referred to as encoder] to a receiver communication device including a video decoder [alternatively referred to as decoder]) based on quadtree structure, where the block size is decided according to the rate-distortion optimization. It is noted that the implementation of using such 2-D filtering may introduce a degree of complexity in accordance with both encoding and decoding. For example, by using 2-D filtering in accordance and implementation of an ALF, there may be some increasing complexity within encoder implemented within the transmitter communication device as well as within a decoder implemented within a receiver communication device.

As mentioned with respect to other embodiments, the use of an ALF can provide any of a number of improvements in accordance with such video processing, including an improvement on the objective quality measure by the peak to signal noise ratio (PSNR) that comes from performing random quantization noise removal. In addition, the subjective quality of a subsequently encoded video signal may be achieved from illumination compensation, which may be introduced in accordance with performing offset processing and scaling processing (e.g., in accordance with FIR filtering applying a gain) in accordance with ALF processing.

With respect to any video encoder architecture implemented to generate an output bitstream, it is noted that such architectures may be implemented within any of a variety of communication devices. The output bitstream may undergo additional processing including error correction code (ECC), forward error correction (FEC), etc. thereby generating a modified output bitstream having additional redundancy deal therein. Also, as may be understood with respect to such a digital signal, it may undergo any appropriate processing in accordance with generating a continuous time signal suitable for or appropriate for transmission via a communication channel. That is to say, such a video encoder architecture may be implemented within a communication device operative to perform transmission of one or more signals via one or more communication channels. Additional processing may be made on an output bitstream generated by such a video encoder architecture thereby generating a continuous time signal that may be launched into a communication channel.

Figure 7:
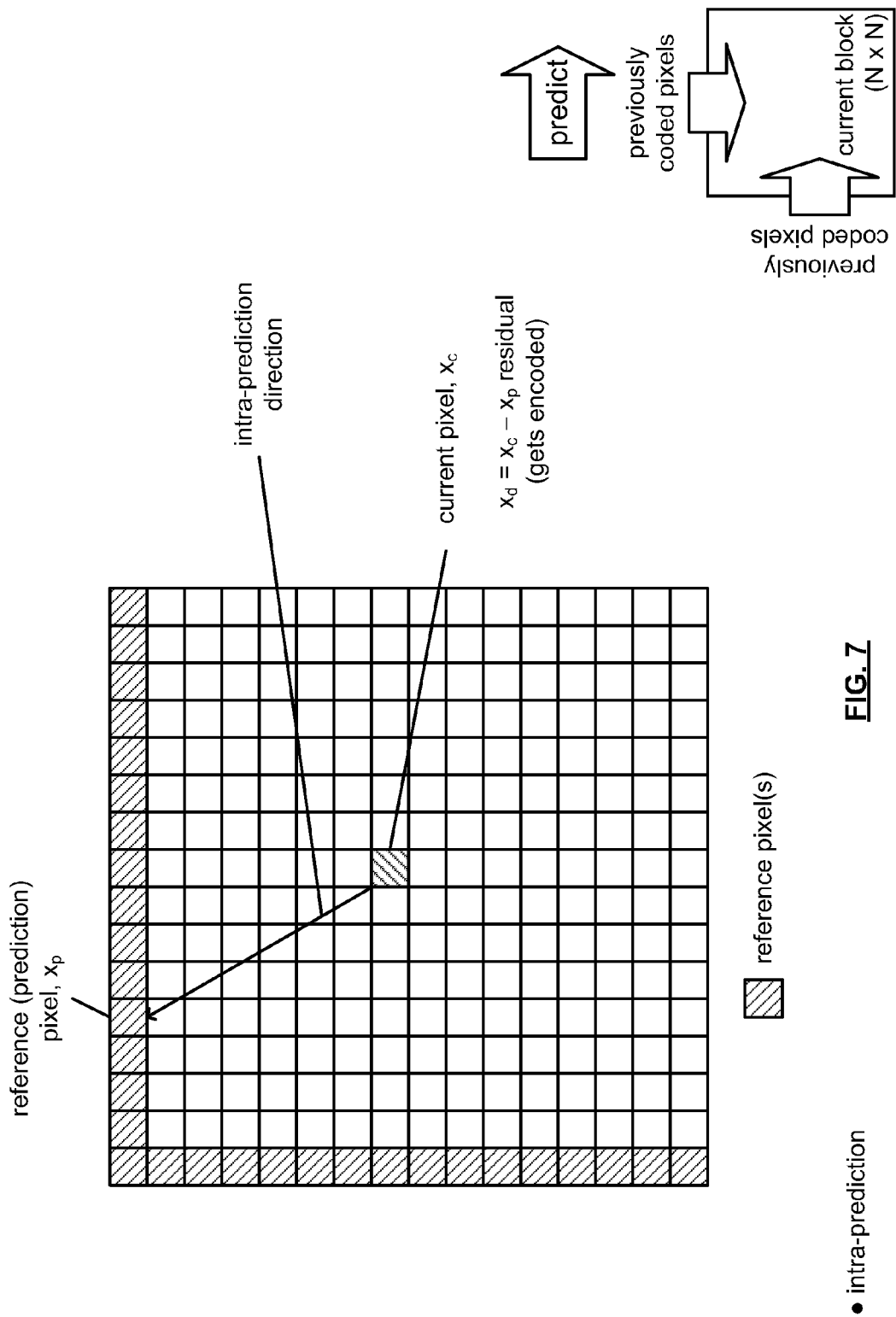
FIG. 7 is a diagram illustrating an embodiment of intra-prediction processing.

FIG. 7 is a diagram illustrating an embodiment 700 of intra-prediction processing. As can be seen with respect to this diagram, a current block of video data (e.g., often times being square in shape and including generally N×N pixels) undergoes processing to estimate the respective pixels therein. Previously coded pixels located above and to the left of the current block are employed in accordance with such intra-prediction. From certain perspectives, an intra-prediction direction may be viewed as corresponding to a vector extending from a current pixel to a reference pixel located above or to the left of the current pixel. Details of intra-prediction as applied to coding in accordance with H.264/AVC are specified within the corresponding standard (e.g., International Telecommunication Union, ITU-T, TELE-COMMUNICATION STANDARDIZATION SECTOR OF ITU, H.264 (March/2010), SERIES H: AUDIOVISUAL AND MULTIMEDIA SYSTEMS, Infrastructure of audiovisual services—Coding of moving video, Advanced video coding for generic audiovisual services, Recommendation ITU-T H.264, also alternatively referred to as International Telecomm ISO/IEC 14496-10—MPEG-4 Part 10, AVC (Advanced Video Coding), H.264/MPEG-4 Part 10 or AVC (Advanced Video Coding), ITU H.264/MPEG4-AVC, or equivalent) that is incorporated by reference above.

The residual, which is the difference between the current pixel and the reference or prediction pixel, is that which gets encoded. As can be seen with respect to this diagram, intra-prediction operates using pixels within a common frame (or picture). It is of course noted that a given pixel may have different respective components associated therewith, and there may be different respective sets of samples for each respective component.

Figure 8:
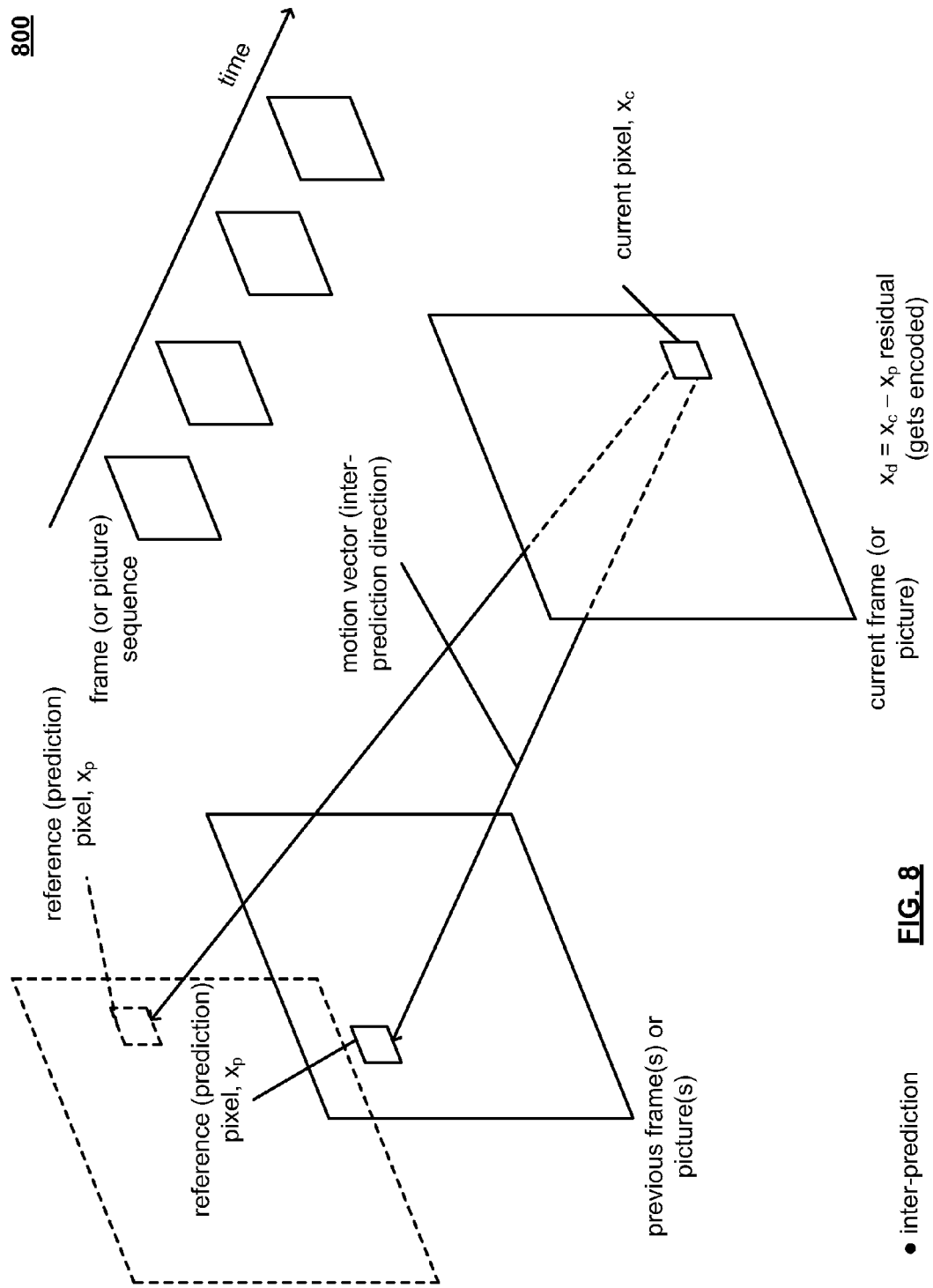
FIG. 8 is a diagram illustrating an embodiment of inter-prediction processing.

FIG. 8 is a diagram illustrating an embodiment 800 of inter-prediction processing. In contradistinction to intra-prediction, inter-prediction is operative to identify a motion vector (e.g., an inter-prediction direction) based on a current set of pixels within a current frame (or picture) and one or more sets of reference or prediction pixels located within one or more other frames (or pictures) within a frame (or picture) sequence. As can be seen, the motion vector extends from the current frame (or picture) to another frame (or picture) within the frame (or picture) sequence. Inter-prediction may utilize sub-pixel interpolation, such that a prediction pixel value corresponds to a function of a plurality of pixels in a reference frame or picture.

A residual may be calculated in accordance with inter-prediction processing, though such a residual is different from the residual calculated in accordance with intra-prediction processing. In accordance with inter-prediction processing, the residual at each pixel again corresponds to the difference between a current pixel and a predicted pixel value. However, in accordance with inter-prediction processing, the current pixel and the reference or prediction pixel are not located within the same frame (or picture). While this diagram shows inter-prediction as being employed with respect to one or more previous frames or pictures, it is also noted that alternative embodiments may operate using references corresponding to frames before and/or after a current frame. For example, in accordance with appropriate buffering and/or memory management, a number of frames may be stored. When operating on a given frame, references may be generated from other frames that precede and/or follow that given frame.

Coupled with the CU, a basic unit may be employed for the prediction partition mode, namely, the prediction unit, or PU. It is also noted that the PU is defined only for the last depth CU, and its respective size is limited to that of the CU.

Figure 9:
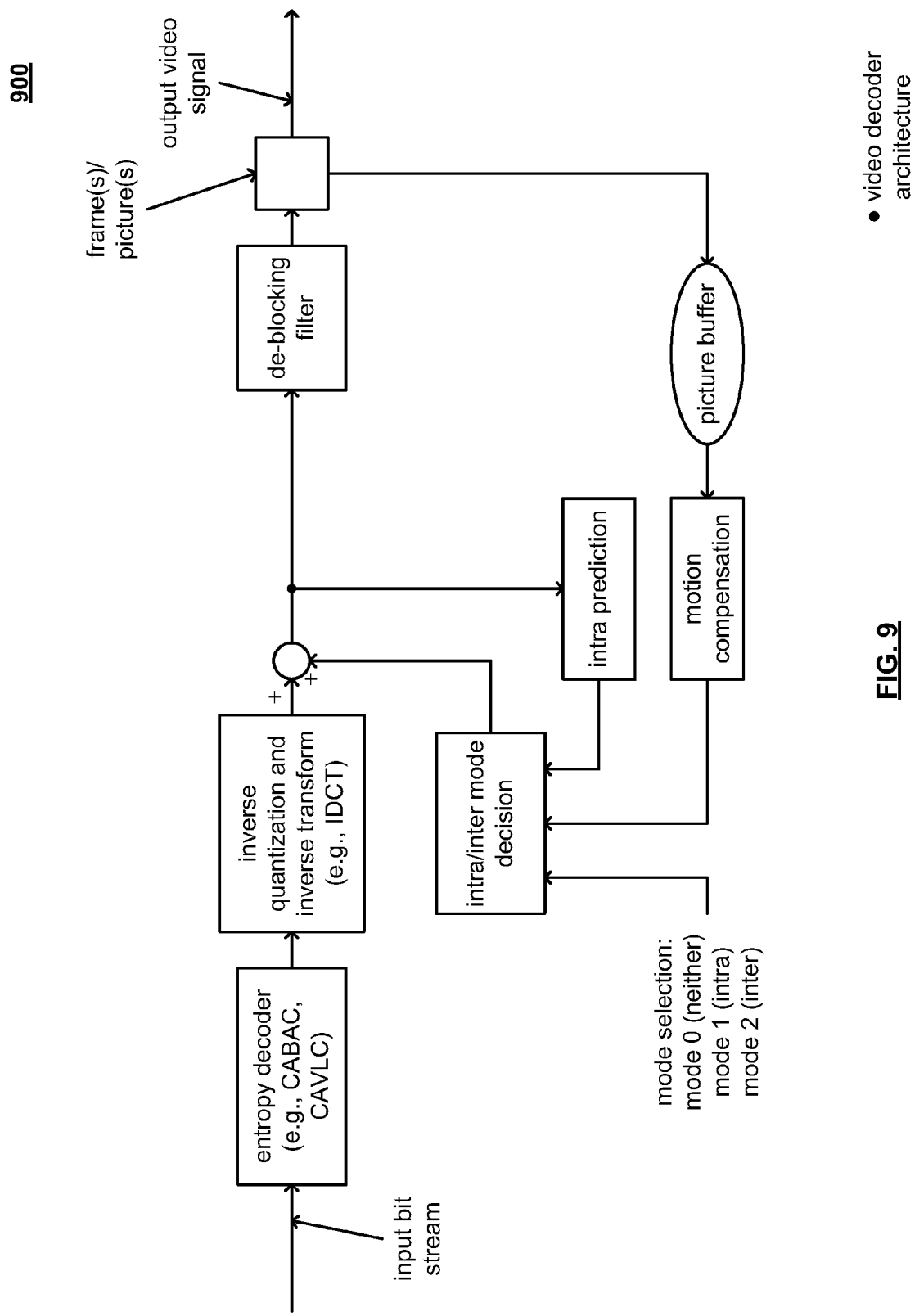
FIG. 9 and FIG. 10 are diagrams illustrating various embodiments of video decoding architectures.
Figure 10:
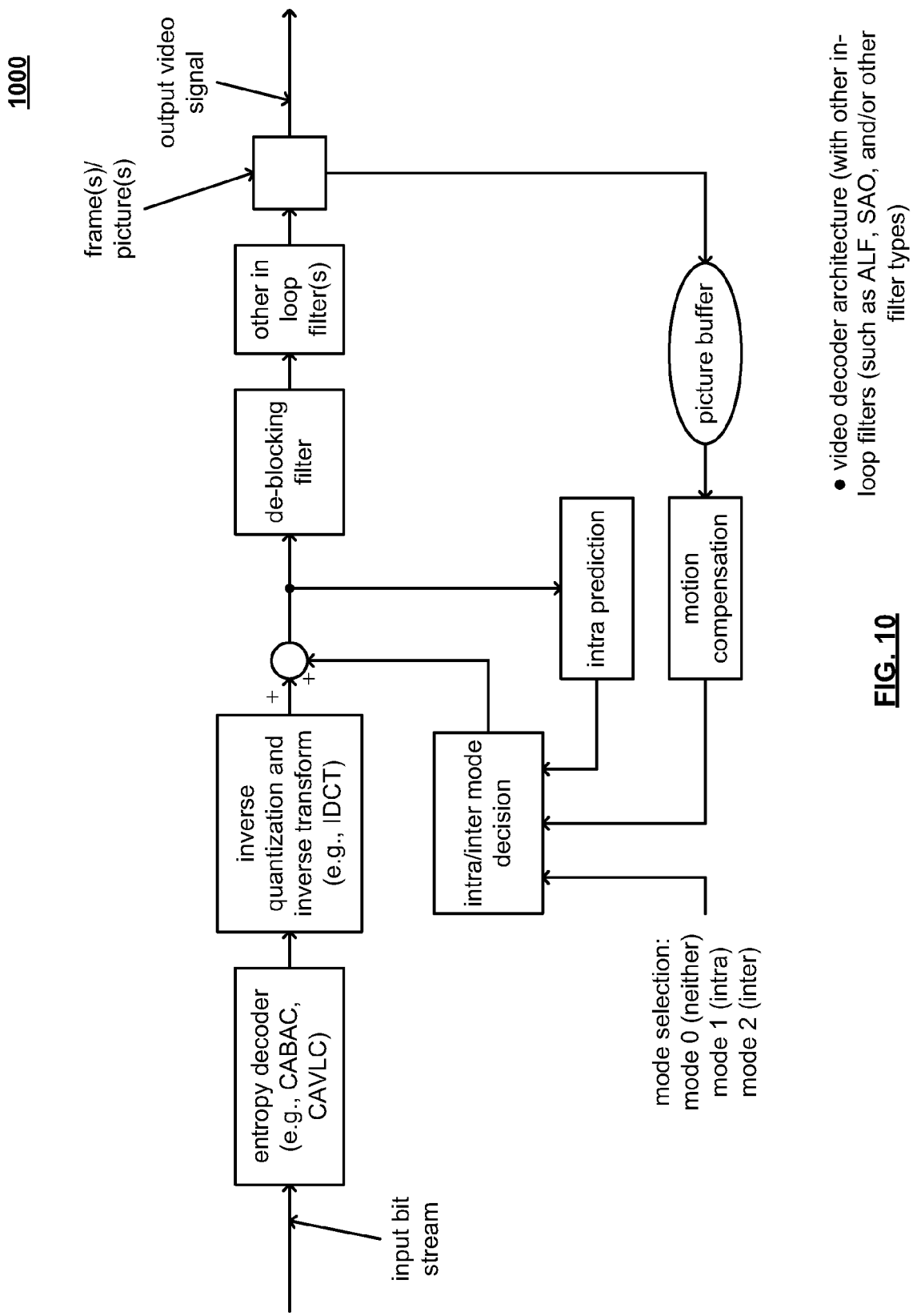

FIG. 9 and FIG. 10 are diagrams illustrating various embodiments 900 and 1000, respectively, of video decoding architectures.

Generally speaking, such video decoding architectures operate on an input bitstream. It is of course noted that such an input bitstream may be generated from a signal that is received by a communication device from a communication channel. Various operations may be performed on a continuous time signal received from the communication channel, including digital sampling, demodulation, scaling, filtering, etc. such as may be appropriate in accordance with generating the input bitstream. Moreover, certain embodiments, in which one or more types of error correction code (ECC), forward error correction (FEC), etc. may be implemented, may perform appropriate decoding in accordance with such ECC, FEC, etc. thereby generating the input bitstream. That is to say, in certain embodiments in which additional redundancy may have been made in accordance with generating a corresponding output bitstream (e.g., such as may be launched from a transmitter communication device or from the transmitter portion of a transceiver communication device), appropriate processing may be performed in accordance with generating the input bitstream. Overall, such a video decoding architectures and lamented to process the input bitstream thereby generating an output video signal corresponding to the original input video signal, as closely as possible and perfectly in an ideal case, for use in being output to one or more video display capable devices.

Referring to the embodiment 900 of FIG. 9, generally speaking, a decoder such as an entropy decoder (e.g., which may be implemented in accordance with CABAC, CAVLC, etc.) processes the input bitstream in accordance with performing the complementary process of encoding as performed within a video encoder architecture. The input bitstream may be viewed as being, as closely as possible and perfectly in an ideal case, the compressed output bitstream generated by a video encoder architecture. Of course, in a real-life application, it is possible that some errors may have been incurred in a signal transmitted via one or more communication links. The entropy decoder processes the input bitstream and extracts the appropriate coefficients, such as the DCT coefficients (e.g., such as representing chroma, luma, etc. information) and provides such coefficients to an inverse quantization and inverse transform block. In the event that a DCT transform is employed, the inverse quantization and inverse transform block may be implemented to perform an inverse DCT (IDCT) operation. Subsequently, A/D blocking filter is implemented to generate the respective frames and/or pictures corresponding to an output video signal. These frames and/or pictures may be provided into a picture buffer, or a digital picture buffer (DPB) for use in performing other operations including motion compensation. Generally speaking, such motion compensation operations may be viewed as corresponding to inter-prediction associated with video encoding. Also, intra-prediction may also be performed on the signal output from the inverse quantization and inverse transform block. Analogously as with respect to video encoding, such a video decoder architecture may be implemented to perform mode selection between performing it neither intra-prediction nor inter-prediction, inter-prediction, or intra-prediction in accordance with decoding an input bitstream thereby generating an output video signal.

Referring to the embodiment 1000 of FIG. 10, in certain optional embodiments, one or more in-loop filters (e.g., implemented in accordance with sample adaptive offset (SAO) filter, adaptive loop filter (ALF), and/or any other filter type) such as may be implemented in accordance with video encoding as employed to generate an output bitstream, a corresponding one or more in-loop filters may be implemented within a video decoder architecture. In one embodiment, an appropriate implementation of one or more such in-loop filters is after the de-blocking filter.

FIG. 11 illustrates an embodiment 1100 of a table showing binarization of macroblock quantizer delta syntax elements for context-adaptive binary arithmetic coding (CABAC) and context-adaptive variable-length coding (CAVLC) entropy encoding.

In accordance with video coding such as that which is performed in accordance with AVC/H.264 (e.g., incorporated by reference above), an encoder can choose between two different entropy coding methods, Context Adaptive Binary Arithmetic Coding (CABAC) and Context Adaptive Variable Length Coding (CAVLC). CABAC provides high compression efficiency, but is relatively more computationally complex than CAVLC. CAVLC offers relatively lower complexity, but provides less compression in general and also relative to CABAC. In accordance with certain embodiments of video processing architectures, separate and respective circuitry, hardware, software, processing modules, components, etc. may be implemented for performing respective video encoding operations in accordance with CABAC and CAVLC. That is to say, because of the inherent difference in dissimilarity between CABAC and CAVLC, different respective circuitry, hardware, software, processing modules, components, etc. are provisioned for each of CABAC and CAVLC.

Generally speaking, both CAVLC and CABAC use separate and distinct variable length binary codes to represent syntax elements. For example, the binarization/codewords for the macroblock quantizer delta syntax element (mb_qp_delta) are shown in FIG. 11. As can be seen, for the very same macro block quantizer delta syntax element, each of CABAC and CAVLC will generate different respective values. With respect to CABAC, bins are generated whereas with respect to CAVLC, bits are generated. That is to say, with respect to CABAC, the generated CABAC bins subsequently undergo arithmetic encoding for generating bits that are subsequently inserted into the compressed bitstream. Stated another way, the codewords used to represent CAVLC syntax elements are referred to simply as bits. These bits are inserted directly into the compressed bitstream. The binarization of CABAC syntax elements are referred to as bins. These bins are further compressed through using adaptive arithmetic encoding process to generate the bits CABAC bits that are inserted into the compressed bitstream.

Figure 12:
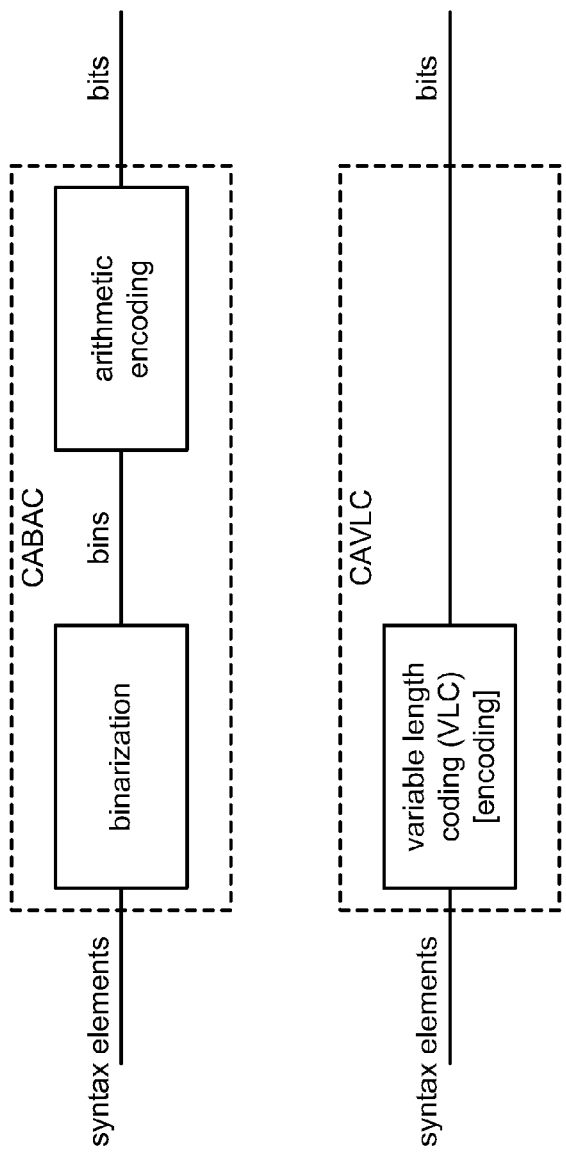
FIG. 12 illustrates an embodiment of separate and respective architectures respectively for CABAC and CAVLC entropy encoding.

FIG. 12 illustrates an embodiment 1200 of separate and respective architectures respectively for CABAC and CAVLC entropy encoding. As can be seen, respective syntax elements undergo binarization in accordance with CABAC entropy encoding thereby generating respective CABAC bins, and these CABAC bins subsequently undergo arithmetic encoding to generate the CABAC bits that are inserted into the compressed bitstream.

With respect to CAVLC entropy encoding, syntax elements undergo variable length coding (VLC) in coding to generate the CAVLC bits that are inserted into the compressed bitstream.

Figure 13:
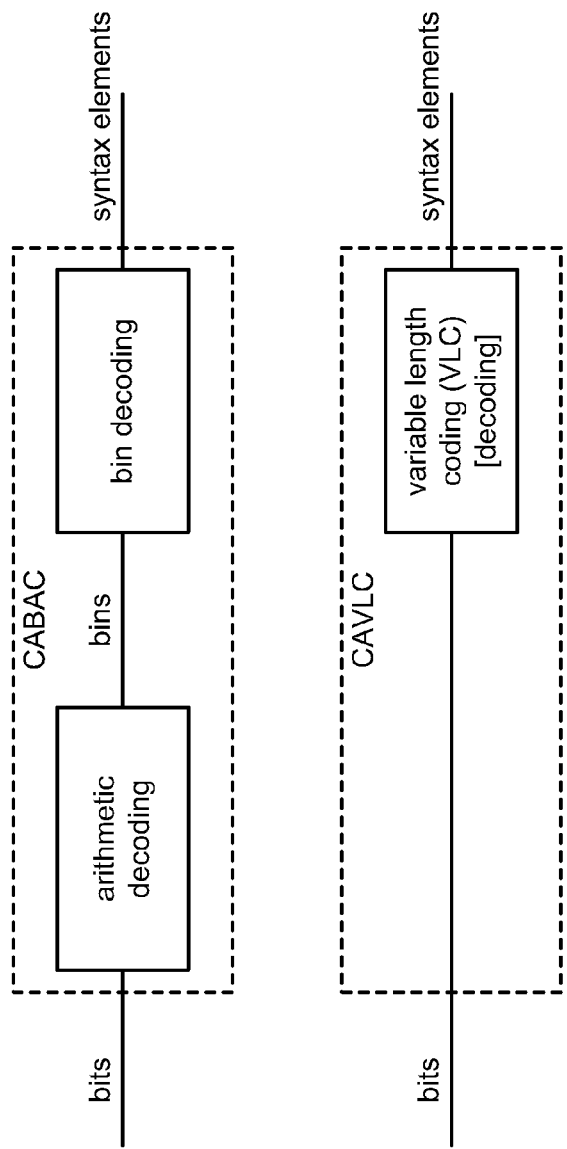
FIG. 13 illustrates an embodiment of separate and respective architectures respectively for CABAC/CAVLC entropy decoding.

FIG. 13 illustrates an embodiment 1300 of separate and respective architectures respectively for CABAC/CAVLC entropy decoding. The reverse operations performed within this diagram as with respect to the previous diagram, FIG. 12. For example, with respect to CABAC entropy decoding, bits are received and undergo arithmetic decoding thereby generating CABAC bins, which subsequently undergo bin decoding thereby generating syntax elements. Ideally (e.g., assuming no non-recoverable errors, deleterious effects, etc.), the syntax elements which are generated in accordance with CABAC entropy decoding are identical to those syntax elements which have been generated in accordance with CABAC entropy encoding.

With respect to CAVLC entropy decoding, bits are received and undergo variable length coding (VLC) decoding thereby generating syntax elements. Ideally (e.g., assuming no non-recoverable errors, deleterious effects, etc.), the syntax elements which are generated in accordance with CAVLC entropy decoding are identical to those syntax elements which have been generated in accordance with CAVLC entropy encoding.

The variable length coding used in CAVLC and the binarization used in CABAC are very similar processes. They both simply map syntax element values to strings of binary 1s and 0s. However, you will notice from the example above that CABAC and CAVLC are not identical. In fact, CAVLC syntax is often quite different when compared with CABAC.

As the reader will understand, there are differences between CABAC and CAVLC coding. Generally speaking, a typical approach by which such video coding devices are designed implements separate and respective circuitry, hardware, software, processing module(s), component(s), real estate, die size, and/or processing resource(s), etc. for each of the CABAC and CAVLC coding operations. However, while there are certain differences between CABAC and CAVLC coding, and appropriately designed device may be constructed in which certain commonality between the two respective coding approaches may be made. That is to say, an appropriately designed process by which each of CABAC and CAVLC coding share at least some common characteristics can provide for the ability to scale the entropy coding complexity in certain applications. For example, by designing an architecture in which the CABAC and CAVLC coding approaches share an appropriate amount of processing, a reduction in circuitry, hardware, software, processing module(s), component(s), real estate, die size, and/or processing resource(s), etc. may be achieved by sharing common components and architecture for both CABAC and CAVLC coding.

For example, a majority of the video processing devices may include functionality and capability for supporting both CABAC and CAVLC coding in which a majority of such video processing devices are operative to perform both CABAC and CAVLC entropy encoding as well as CABAC and CAVLC entropy decoding. For hardware-based decoders implemented and operative to support both CABAC and CAVLC entropy decoding, a necessary requirement to support both types of decoding, namely, CABAC and CAVLC entropy decoding, typically requires specialized hardware blocks for parsing both the CAVLC and the CABAC syntax. That is to say, separate and distinct hardware blocks are implemented respectively for supporting both the CAVLC and the CABAC syntaxes. While this duplicated functionality may be included within certain video processing devices implemented to support and be compliant in accordance with AVC, this may be a relatively inefficient use of resources within such a video processing device. Also, such duplicated functionality may unfortunately increase the cost, complexity, die size, real estate, processing resources, etc. of a video processing device implemented to support both CABAC and CAVLC coding separately and distinctly with respect to another.

Herein, a unified CABAC/CAVLC coding architecture and/or method is presented that may provide for scalable complexity within video processing devices. For example, in one such video coding standard currently under development, such as HEVC/H.265 (e.g., incorporated by reference above), such a unified CABAC/CAVLC coding architecture may be employed such that a single entropy coding architecture and/or method can provide for scalable complexity. Specifically, in accordance with the unified CABAC/CAVLC coding architecture and/or method in accordance with various aspects, and their equivalents, of the invention, various options may be implemented to provide for various designs and trade-offs between efficiency and complexity without requiring two completely independent entropy coding architectures and/or methods including any possible duplicate of implementations of circuitry, hardware, software, processing module(s), component(s), real estate, die size, and/or processing resource(s), etc.

As can be seen with respect to FIG. 11 above, different respective values are generated in accordance with CABAC entropy encoding, specifically with respect to bins, and generated in accordance with CAVLC entropy in coding, specifically with respect to bits. In certain embodiments, an entirely different binarization may be employed in accordance with CABAC entropy encoding. That is to say, instead of employing the specific binarization currently employed in accordance with CABAC entropy encoding, a differently implemented variable length binarization, or variant thereof, may be employed instead. As will be understood with respect to other diagrams and/or embodiments presented herein, by employing an appropriately designed combination of variable length binarization and arithmetic encoding in accordance with CABAC entropy encoding, commonality may be achieved with respect to CAVLC entropy encoding. As will be understood with respect to other diagrams and/or embodiments presented herein, there is great latitude in variation provided to a designer for implementing such a unified CABAC/CAVLC coding architecture and/or method in accordance with various aspects, and their equivalents, of the invention.

Figure 14:
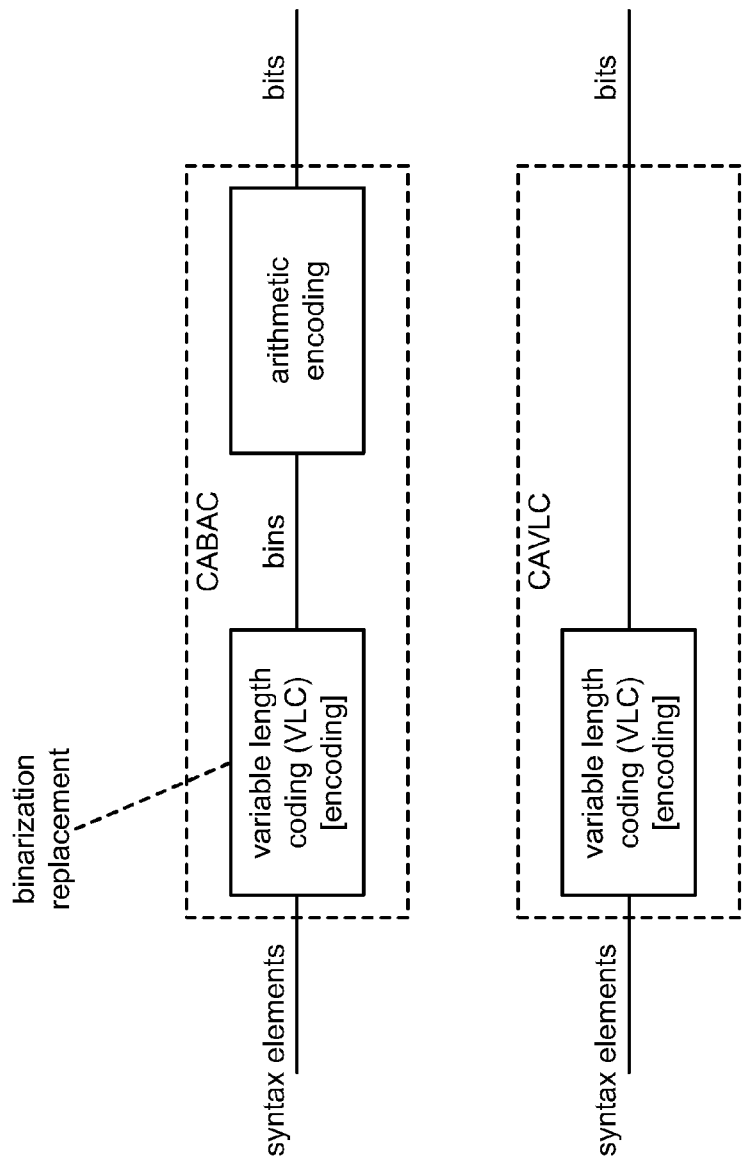
FIG. 14 illustrates an embodiment of separate and respective architectures respectively for CABAC and CAVLC entropy encoding, and specifically in which variable length coding (VLC) encoding is employed.

FIG. 14 illustrates an embodiment 1400 of separate and respective architectures respectively for CABAC and CAVLC entropy encoding, and specifically in which variable length coding (VLC) encoding is employed.

As can be seen when comparing the embodiment 1400 to the embodiment 1200 of FIG. 12, binarization processing employed in accordance with CABAC entropy encoding is replaced with the variable length coding (VLC) encoding that is employed in accordance with CAVLC entropy encoding in the embodiment 1200 of FIG. 12. That is to say, the very same variable length coding (VLC) encoding is employed for both CABAC entropy encoding and CAVLC entropy encoding within the embodiment 1400. When performing CABAC entropy encoding, the bins that are generated in accordance with variable length coding (VLC) encoding subsequently undergo arithmetic encoding thereby generating the CABAC bits that are inserted into the compressed bitstream.

With respect to performing CAVLC encoding, the operations and processes depicted in the bottom portion of the diagram are analogous and similar to that which are performed within the embodiment 1200 of FIG. 12. That is to say, with respect to CAVLC entropy encoding within the embodiment 1400, syntax elements undergo VLC encoding thereby generating the CAVLC bits that are inserted into the compressed bitstream.

From certain perspectives, such an embodiment 1400 as depicted with respect to FIG. 14 may be understood as using the VLC encoding from AVC in place of the binarization typically employed in accordance with CABAC encoding. In accordance with other diagrams and/or embodiments presented herein, the reader will properly understand that different respective embodiments of variable length binarization may alternatively be employed. That is to say, the use of VLC encoding from AVC in place of the binarization typically employed in accordance with CABAC encoding is one possible embodiment, but many other embodiments, variations, equivalents, etc. may alternatively be employed as desired.

Figure 15:
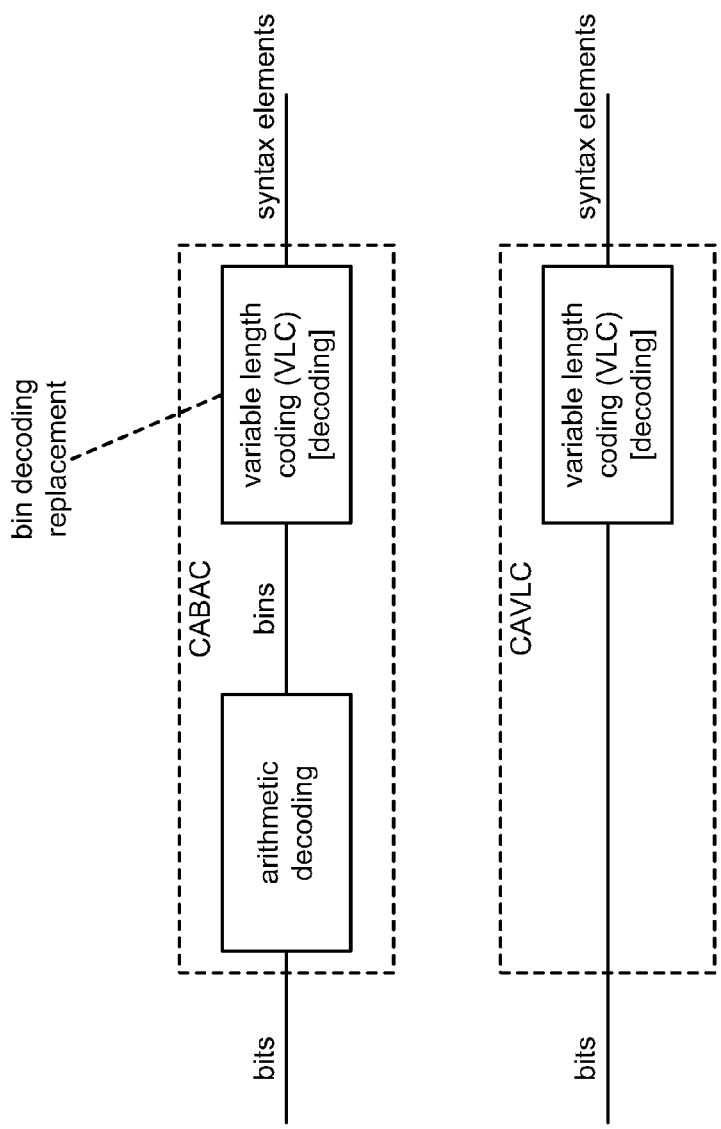
FIG. 15 illustrates an embodiment of separate and respective architectures respectively for CABAC and CAVLC entropy decoding, and specifically in which VLC decoding is employed.

FIG. 15 illustrates an embodiment 1500 of separate and respective architectures respectively for CABAC and CAVLC entropy decoding, and specifically in which VLC decoding is employed. As can be seen when comparing the embodiment 1500 to the embodiment 1300 of FIG. 13, bin decoding in accordance with CABAC entropy decoding is replaced with variable length coding (VLC) decoding that is employed in accordance with CAVLC entropy decoding in the embodiment 1300 of FIG. 13. That is to say, the very same VLC decoding is employed for both CABAC entropy decoding and CAVLC entropy decoding within the embodiment 1500. When performing CABAC entropy decoding, the bins that are generated in accordance with arithmetic decoding subsequently undergo VLC decoding thereby generating the syntax elements which have been generated in accordance with CABAC entropy encoding. As also mentioned with respect to other diagrams and/or embodiments, ideally (e.g., assuming no non-recoverable errors, deleterious effects, etc.), the syntax elements which are generated in accordance with CABAC entropy decoding are identical to those syntax elements which have been generated in accordance with CABAC entropy encoding.

With respect to performing CAVLC decoding, the operations and processes depicted in the bottom portion of the diagram are analogous and similar to that which are performed within the embodiment 1300 of FIG. 13. That is to say, with respect to CAVLC entropy decoding within the embodiment 1500, bits undergo VLC decoding thereby generating the syntax elements which have been generated in accordance with CAVLC entropy encoding. As also mentioned with respect to other diagrams and/or embodiments, ideally (e.g., assuming no non-recoverable errors, deleterious effects, etc.), the syntax elements which are generated in accordance with CABAC entropy decoding are identical to those syntax elements which have been generated in accordance with CABAC entropy encoding.

As can be seen with respect to the embodiment 700 of FIG. 7, and the embodiment 1500 of FIG. 15, different respective implementations of certain functional blocks and/or components are implemented within each of the CABAC and CAVLC coding architectures and/or methods. Given the commonality and similarity between the respective implementations of CABAC and CAVLC coding architectures and/or methods, certain of the subsequent embodiments and/or diagrams operate to combine and share such functional blocks and/or component. For example, different and separately implemented functional blocks and/or component need not necessarily be employed for both the CABAC and CAVLC coding architectures and/or methods. Because of certain commonality and similarity between the respective implementations of CABAC and CAVLC coding architectures and/or methods, savings may be made in accordance with the circuitry, hardware, software, processing module(s), component(s), real estate, die size, and/or processing resource(s), etc. as many employed for supporting both CABAC and CAVLC coding.

Figure 16A:
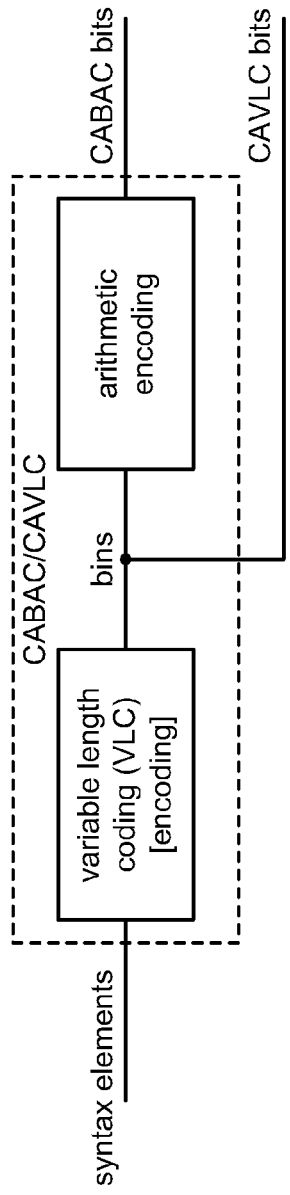
FIG. 16A illustrates an embodiment of a unified architecture for both CABAC and CAVLC entropy encoding, and specifically in which variable length coding (VLC) encoding is employed.

FIG. 16A illustrates an embodiment 1600 of a unified architecture for both CABAC and CAVLC entropy encoding, and specifically in which variable length coding (VLC) encoding is employed. As can be seen with respect to the embodiment 1600 of FIG. 16A, VLC encoding is employed and shared for both CABAC and CAVLC entropy encoding. Syntax elements undergo VLC encoding. In accordance with CAVLC encoding, the VLC encoded syntax elements are provided as the CAVLC bits that are inserted into the compressed bitstream. However, in accordance with CABAC encoding the VLC encoded syntax elements subsequently undergo arithmetic encoding thereby generating the CABAC bits that are inserted into the compressed bitstream. As can be seen with respect to the embodiment 1600, shared functional blocks and/or component may be employed for supporting both CABAC and CAVLC entropy encoding.

Figure 16B:
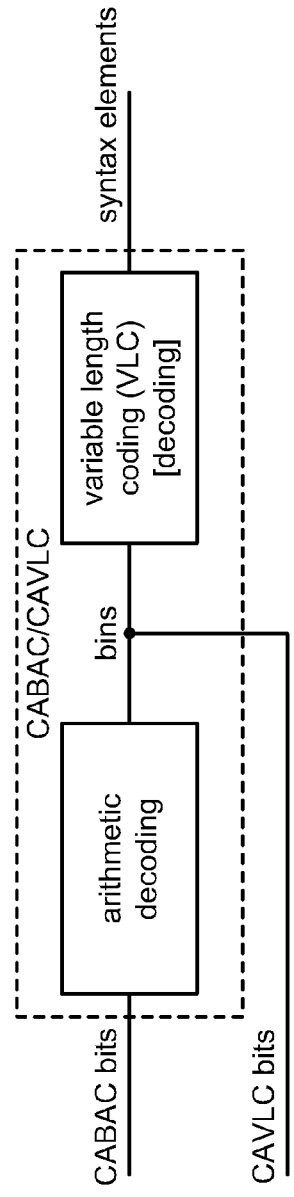
FIG. 16B illustrates an embodiment of a unified architecture for both CABAC and CAVLC entropy decoding, and specifically in which variable length coding (VLC) decoding is employed.

FIG. 16B illustrates an embodiment 1601 of a unified architecture for both CABAC and CAVLC entropy decoding, and specifically in which variable length coding (VLC) decoding is employed. As can be seen with respect to the embodiment 1601 of FIG. 16B, VLC decoding is employed and shared for both CABAC and CAVLC entropy decoding. Depending upon the particular implementation being employed, CABAC bits or CAVLC bits are received by the entropy decoding architecture and/or method. In accordance with CAVLC entropy decoding, the received CAVLC bits undergo VLC decoding thereby generating syntax elements. Ideally (e.g., assuming no non-recoverable errors, deleterious effects, etc.), the syntax elements which are generated in accordance with CAVLC entropy decoding are identical to those syntax elements which have been generated in accordance with CAVLC entropy encoding.

In accordance with the CABAC entropy decoding, the received CABAC bits undergo arithmetic decoding thereby generating the bins which subsequently undergo VLC decoding thereby generating syntax elements. Ideally (e.g., assuming no non-recoverable errors, deleterious effects, etc.), the syntax elements which are generated in accordance with CABAC entropy decoding are identical to those syntax elements which have been generated in accordance with CABAC entropy encoding As can be seen with respect to the embodiments 1600 and 1601, commonly employed functional blocks and/or components are employed for both CABAC and CAVLC entropy coding. In the instant case, VLC encoding is employed for both CABAC and CAVLC entropy encoding in the embodiment 1600; VLC decoding is employed for both CABAC and CAVLC entropy decoding in the embodiment 1601. Appropriately designed and commonly shared VLC and coding and VLC decoding allows for a more efficient implementation of an architecture and/or method operable to support both CABAC and CAVLC entropy coding. While the embodiments 1600 and 1601 employed VLC encoding and VLC decoding for use in CABAC and CAVLC entropy coding, it is noted that other implementations of commonly shared functional blocks and/or components may instead be employed within a unified implementation of binarization for CABAC/CAVLC entropy coding. That is to say, the embodiments 1600 and 1601 as depicted within the FIG. 16A and the FIG. 16B, respectively, employ common VLC encoding and VLC decoding, respectively, for supporting CABAC/CAVLC entropy coding, alternative forms of variable length binarization may be employed in other embodiments.

Figure 17A:
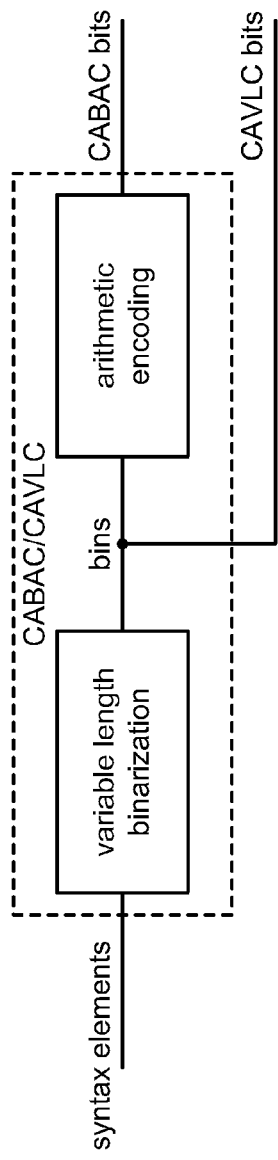
FIG. 17A illustrates an embodiment of a unified architecture for both CABAC and CAVLC entropy encoding, and specifically in which variable length binarization is employed.

FIG. 17A illustrates an embodiment 1700 of a unified architecture for both CABAC and CAVLC entropy encoding, and specifically in which variable length binarization is employed. The embodiment 1700 generally depicts a variable length binarization that is commonly employed for both CABAC and CAVLC entropy encoding. As can be seen with respect to the FIG. 17A, syntax elements undergo variable length binarization for both CABAC and CAVLC entropy encoding. However, with respect to CABAC encoding, the syntax elements that have undergone variable length binarization, thereby generating bins, subsequently undergo arithmetic encoding thereby generating the CABAC bits that are inserted into the compressed bitstream. Alternatively, with respect to CAVLC encoding, the syntax elements that have undergone variable length binarization are in fact the CAVLC bits that are inserted into the compressed bitstream.

As may be understood with respect to this embodiment 1700 of FIG. 17A, a single unified binarization is employed for both CABAC and CAVLC entropy encoding. For example, given similarities between CABAC binarization and CAVLC variable length coding, a generalized, single unified binarization may be employed for both CABAC and CAVLC entropy encoding. Again, it is noted that one possible embodiment of such a single unified binarization would be to employ the VLC encoding employed in accordance with AVC. However, alternative variations of such a single unified binarization may alternatively be employed besides that which is employed in accordance with AVC.

Figure 17B:
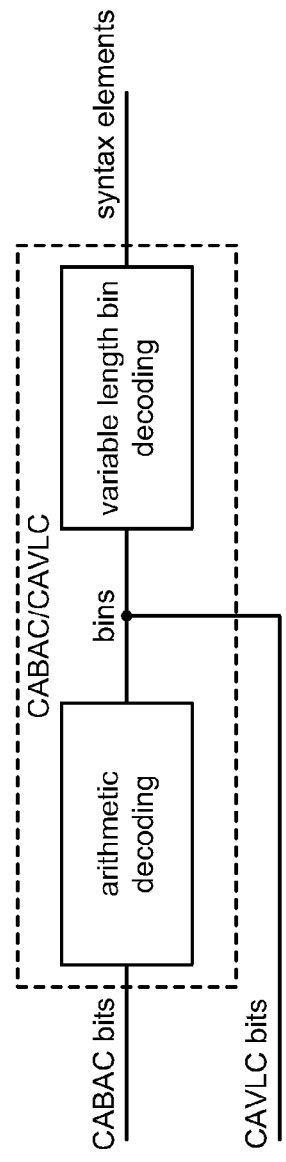
FIG. 17B illustrates an embodiment of a unified architecture for both CABAC and CAVLC entropy decoding, and specifically in which variable length bin decoding is employed.

FIG. 17B illustrates an embodiment 1701 of a unified architecture for both CABAC and CAVLC entropy decoding, and specifically in which variable length bin decoding is employed. The embodiment 1701 generally depicts a variable length bin decoding that is commonly employed for both CABAC and CAVLC entropy decoding. As can be seen with respect to the FIG. 17B, variable length bin decoding is employed and shared for both CABAC and CAVLC entropy decoding. Depending upon the particular implementation being employed, CABAC bits or CAVLC bits are received by the entropy decoding architecture and/or method. In accordance with CAVLC entropy decoding, the received CAVLC bits undergo variable length bin decoding thereby generating syntax elements. Ideally (e.g., assuming no non-recoverable errors, deleterious effects, etc.), the syntax elements which are generated in accordance with CAVLC entropy decoding are identical to those syntax elements which have been generated in accordance with CAVLC entropy encoding.

In accordance with the CABAC entropy decoding, the received CABAC bits undergo arithmetic decoding thereby generating the bins which subsequently undergo variable length bin decoding thereby generating syntax elements. Ideally (e.g., assuming no non-recoverable errors, deleterious effects, etc.), the syntax elements which are generated in accordance with CABAC entropy decoding are identical to those syntax elements which have been generated in accordance with CABAC entropy encoding.

In accordance with the development of future video coding standards, including those currently under development such as HEVC, appropriately designed variable length binarization may be employed so that the output of CABAC decompression (bins) would use the exact same syntax as CAVLC. In this way, the encoder can choose whether to provide high-efficiency or low-complexity, but only a single syntax parsing engine would be required for VLC decoding. As can be seen, by providing such an architecture and/or method operative to support both CABAC and CAVLC entropy coding, a single syntax parsing engine may be employed.

It is noted that, when high-efficiency coding is desired, an entropy encoder can perform both binarization and arithmetic encoding. When low-complexity is needed, the arithmetic encoding step is simply skipped or bypassed. The binary codes used in both cases (CABAC and CAVLC entropy coding) are identical so no additional syntax parser is required.

The complexity distribution between the adaptive arithmetic encoding and the binarization steps might also be modified to better match the novel architecture and/or method presented herein. For example, a designer is provided a great deal of latitude in regards to modifying the complexity of variable length binarization and the arithmetic encoding. For example, if a fixed compression is desired for CABAC entropy encoding, then the degree to which complexity of the variable length binarization is modified will direct the corresponding modification of complexity of the arithmetic encoding. For example, if the complexity of the variable length binarization is increased to a degree, then the complexity of the arithmetic encoding will be decreased to a corresponding degree so that the overall compression in accordance with CABAC entropy encoding will remain unchanged. Alternatively, if the complexity of the variable length binarization is decreased to a degree, then the complexity of the arithmetic encoding will be increased to a corresponding degree so that the overall compression in accordance with CABAC entropy encoding will remain unchanged. Such implementations are described with respect to certain other of the embodiments and/or diagrams presented herein. As will also be understood, the overall compression of both CABAC and CAVLC entropy encoding may be increased or decreased depending on a particular implementation as desired any given application.

Considering an embodiment in which CABAC binarization as defined in accordance with AVC is employed, it may be noted that CABAC binarization, by itself, defined in AVC may be viewed as providing somewhat relatively weak compression in comparison to the overall compression as provided by CABAC entropy encoding and/or CAVLC entropy encoding. That is to say, the binarization operation in accordance with CABAC entropy encoding, such as with respect to the embodiment 1200 of FIG. 12, may be viewed as providing relatively weak compression in comparison to other overall entropy encoding schemes. Since CABAC bins are passed through an additional arithmetic encoding step (again, such as may be seen with respect embodiment 1200 FIG. 12), the specific binary codes used for AVC CABAC need not be particularly efficient, given that they may rely upon additional compression as provided by the arithmetic encoding step. CAVLC, on the other hand, provides quite efficient variable length coding. While CAVLC entropy encoding may be relatively less efficient than CABAC encoding overall (e.g., when arithmetic encoding is used), CAVLC, and particularly the VLC encoding component thereof, may be acceptable in certain applications given its reduction in complexity.

In a unified binarization scheme such as in accordance with various aspects, and their equivalents, of the invention as presented herein, the arithmetic encoding context adaptation might be slightly weakened given the stronger binary codes used up front. As may also be understood with respect to other embodiments and/or diagrams presented herein, depending upon a ticket application, and appropriate determination of a suitable tradeoff between increased compression efficiency and complexity may be selected when using such a redefined and/or modified CABAC binarization. For example, in an embodiment that seeks to provide the same overall compression, a relatively stronger binarization may be combined with a relatively or slightly weaker adaptive arithmetic encoder to provide for the same overall performance as the existing CABAC process without increasing the total complexity.

Several of the subsequent diagrams and/or embodiments depict certain trade-offs which may be made with respect to increasing or decreasing complexity with respect to variable length binarization and/or increasing or decreasing complexity with respect to arithmetic encoding in accordance with CABAC/CAVLC entropy encoding. Also, several the subsequent diagrams and/or embodiments depict certain trade-offs which may be made with respect to increasing or decreasing complexity with respect to variable length bin decoding and/or increasing or decreasing complexity with respect to arithmetic decoding in accordance with CABAC/CAVLC entropy decoding.

FIG. 18A illustrates an embodiment 1800 of a unified architecture for both CABAC and CAVLC entropy encoding, and specifically in which increased complexity variable length binarization is employed, and also specifically in conjunction with reduced complexity arithmetic encoding for CABAC entropy encoding. The embodiment 1800 generally depicts a variable length binarization of relatively increased complexity that is commonly employed for both CABAC and CAVLC entropy encoding. As can be seen with respect to the FIG. 18A, syntax elements undergo variable length binarization of relatively increased complexity for both CABAC and CAVLC entropy encoding. However, with respect to CABAC encoding, the syntax elements that have undergone variable length binarization of relatively increased complexity, thereby generating bins, subsequently undergo arithmetic encoding of relatively reduced complexity thereby generating the CABAC bits that are inserted into the compressed bitstream. Alternatively, with respect to CAVLC encoding, the syntax elements that have undergone variable length binarization of relatively increased complexity are in fact the CAVLC bits that are inserted into the compressed bitstream.

As can be seen, when it is desired to maintain a relatively fixed CABAC compression, certain trade-offs may be made with respect to the variable length binarization and the arithmetic and coding in accordance with CABAC/CAVLC entropy encoding. Generally speaking, when the complexity of the variable length binarization increases, then the complexity of the arithmetic encoding should correspondingly be decreased. Alternatively, when the complexity of the variable length binarization decreases, then the complexity of the arithmetic encoding should correspondingly be increased. Again, with respect to such an embodiment, such correspondingly increasing/decreasing complexity with respect to the different functional blocks and/or components is made to ensure a relatively fixed CABAC compression. Of course, as can be seen with respect to the embodiment 1800 and FIG. 18A, when performing CAVLC entropy encoding, a relatively increased complexity variable length binarization will provide a relatively greater compression than would otherwise be performed in accordance with typical CAVLC entropy encoding.

FIG. 18B illustrates an embodiment 1801 of a unified architecture for both CABAC and CAVLC entropy decoding, and specifically in which increased complexity variable length bin decoding is employed in accordance with CABAC entropy decoding, and also specifically in conjunction with reduced complexity arithmetic decoding for CABAC entropy decoding. The operations within the embodiment 1801 of FIG. 18B may properly be understood as being the complementary or reverse operations as those depicted within the embodiment 1800 and FIG. 18A.

The embodiment 1801 generally depicts a variable length bin decoding of relatively increased complexity that is commonly employed for both CABAC and CAVLC entropy decoding. As can be seen with respect to the FIG. 18B, variable length bin decoding of relatively increased complexity is employed and shared for both CABAC and CAVLC entropy decoding. Depending upon the particular implementation being employed, CABAC bits or CAVLC bits are received by the entropy decoding architecture and/or method. In accordance with CAVLC entropy decoding, the received CAVLC bits undergo variable length bin decoding of relatively increased complexity thereby generating syntax elements. Ideally (e.g., assuming no non-recoverable errors, deleterious effects, etc.), the syntax elements which are generated in accordance with CAVLC entropy decoding are identical to those syntax elements which have been generated in accordance with CAVLC entropy encoding.

In accordance with the CABAC entropy decoding, the received CABAC bits undergo arithmetic decoding of relatively reduced complexity thereby generating the bins which subsequently undergo variable length bin decoding of relatively increased complexity thereby generating syntax elements. Ideally (e.g., assuming no non-recoverable errors, deleterious effects, etc.), the syntax elements which are generated in accordance with CABAC entropy decoding are identical to those syntax elements which have been generated in accordance with CABAC entropy encoding.

FIG. 19A illustrates an embodiment 1900 of a unified architecture for both CABAC and CAVLC entropy encoding, and specifically in which increased complexity variable length binarization is employed. The embodiment 1900 generally depicts a variable length binarization of relatively increased complexity that is commonly employed for both CABAC and CAVLC entropy encoding. As can be seen with respect to the FIG. 19A, syntax elements undergo variable length binarization of relatively increased complexity for both CABAC and CAVLC entropy encoding. However, with respect to CABAC encoding, the syntax elements that have undergone variable length binarization of relatively increased complexity, thereby generating bins, subsequently undergo arithmetic encoding thereby generating the CABAC bits that are inserted into the compressed bitstream. Alternatively, with respect to CAVLC encoding, the syntax elements that have undergone variable length binarization of relatively increased complexity are in fact the CAVLC bits that are inserted into the compressed bitstream.

As can be seen with respect to this diagram, while the variable length binarization of relatively increased complexity, the arithmetic encoding employed in accordance with CABAC entropy encoding is not necessarily of relatively reduced complexity. That is to say, such arithmetic encoding in accordance with CABAC entropy encoding may be unchanged. As such, it may be understood that the overall compression of both CABAC and CAVLC entropy encoding will correspondingly be increased based upon the increasing complexity of the variable length binarization and employed for both.

FIG. 19B illustrates an embodiment 1901 of a unified architecture for both CABAC and CAVLC entropy decoding, and specifically in which increased complexity variable length bin decoding is employed in accordance with CABAC entropy decoding. The operations within the embodiment 1901 of FIG. 19B may properly be understood as being the complementary or reverse operations as those depicted within the embodiment 1900 and FIG. 19A.

The embodiment 1901 generally depicts a variable length bin decoding of relatively increased complexity that is commonly employed for both CABAC and CAVLC entropy decoding. As can be seen with respect to the FIG. 19B, variable length bin decoding of relatively increased complexity is employed and shared for both CABAC and CAVLC entropy decoding. Depending upon the particular implementation being employed, CABAC bits or CAVLC bits are received by the entropy decoding architecture and/or method. In accordance with CAVLC entropy decoding, the received CAVLC bits undergo variable length bin decoding of relatively increased complexity thereby generating syntax elements. Ideally (e.g., assuming no non-recoverable errors, deleterious effects, etc.), the syntax elements which are generated in accordance with CAVLC entropy decoding are identical to those syntax elements which have been generated in accordance with CAVLC entropy encoding.

In accordance with the CABAC entropy decoding, the received CABAC bits undergo arithmetic decoding thereby generating the bins which subsequently undergo variable length bin decoding of relatively increased complexity thereby generating syntax elements. Ideally (e.g., assuming no non-recoverable errors, deleterious effects, etc.), the syntax elements which are generated in accordance with CABAC entropy decoding are identical to those syntax elements which have been generated in accordance with CABAC entropy encoding.

As can be seen with respect to this diagram, while the variable length bin decoding of relatively increased complexity, the arithmetic decoding employed in accordance with CABAC entropy decoding is not necessarily of relatively reduced complexity. That is to say, such arithmetic decoding in accordance with CABAC entropy encoding may be unchanged. As such, it may be understood that the overall compression of bits that are received in accordance with both CABAC and CAVLC entropy decoding will correspondingly be of a relatively increased compression; consequently, the complexity of the variable length binarization and employed for both CABAC and CAVLC entropy decoding will correspondingly be relatively increased as well.

Figure 20A:
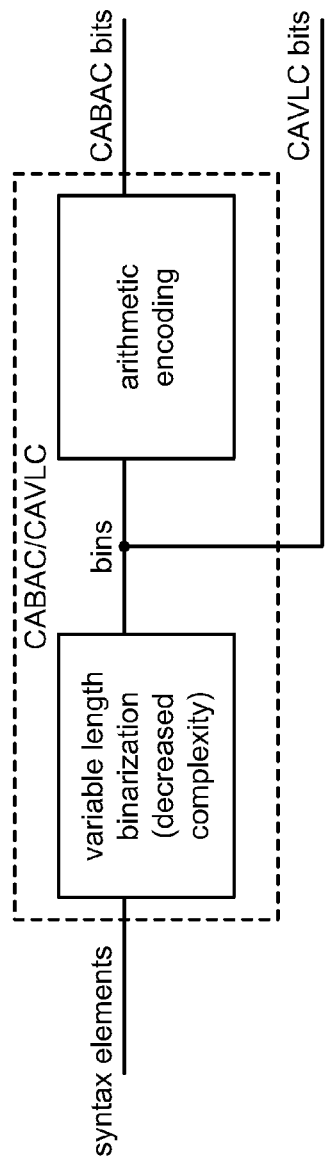
FIG. 20A illustrates an embodiment of a unified architecture for both CABAC and CAVLC entropy encoding, and specifically in which decreased complexity variable length binarization is employed.

FIG. 20A illustrates an embodiment 2000 of a unified architecture for both CABAC and CAVLC entropy encoding, and specifically in which decreased complexity variable length binarization is employed. The embodiment 2000 generally depicts a variable length binarization of relatively decreased complexity that is commonly employed for both CABAC and CAVLC entropy encoding. As can be seen with respect to the FIG. 20A, syntax elements undergo variable length binarization of relatively decreased complexity for both CABAC and CAVLC entropy encoding. However, with respect to CABAC encoding, the syntax elements that have undergone variable length binarization of relatively decreased complexity, thereby generating bins, subsequently undergo arithmetic encoding thereby generating the CABAC bits that are inserted into the compressed bitstream. Alternatively, with respect to CAVLC encoding, the syntax elements that have undergone variable length binarization of relatively decreased complexity are in fact the CAVLC bits that are inserted into the compressed bitstream.

As can be seen with respect to this diagram, while the variable length binarization of relatively decreased complexity, the arithmetic encoding employed in accordance with CABAC entropy encoding is not necessarily of relatively reduced complexity. That is to say, such arithmetic encoding in accordance with CABAC entropy encoding may be unchanged. As such, it may be understood that the overall compression of both CABAC and CAVLC entropy encoding will correspondingly be decreased based upon the decreasing complexity of the variable length binarization and employed for both.

Figure 20B:
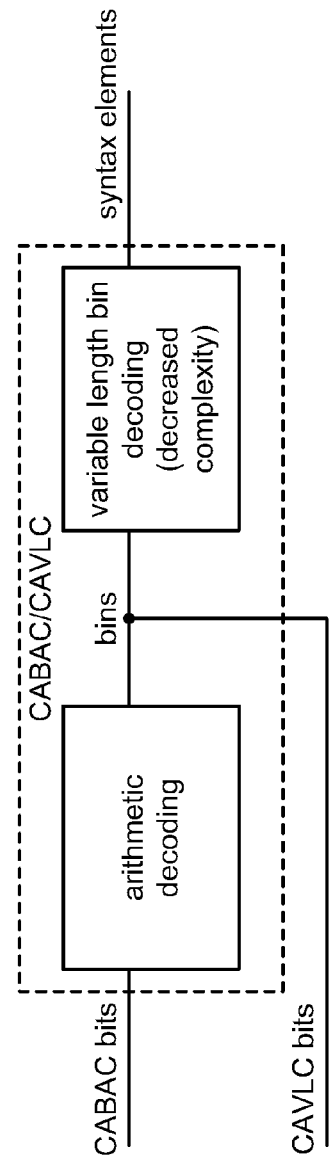
FIG. 20B illustrates an embodiment of a unified architecture for both CABAC and CAVLC entropy decoding, and specifically in which decreased complexity variable length bin decoding is employed in accordance with CABAC entropy decoding.

FIG. 20B illustrates an embodiment 2001 of a unified architecture for both CABAC and CAVLC entropy decoding, and specifically in which decreased complexity variable length bin decoding is employed in accordance with CABAC entropy decoding. The operations within the embodiment 2001 of FIG. 20B may properly be understood as being the complementary or reverse operations as those depicted within the embodiment 2000 and FIG. 20A.

The embodiment 2001 generally depicts a variable length bin decoding of relatively decreased complexity that is commonly employed for both CABAC and CAVLC entropy decoding. As can be seen with respect to the FIG. 20B, variable length bin decoding of relatively decreased complexity is employed and shared for both CABAC and CAVLC entropy decoding. Depending upon the particular implementation being employed, CABAC bits or CAVLC bits are received by the entropy decoding architecture and/or method. In accordance with CAVLC entropy decoding, the received CAVLC bits undergo variable length bin decoding of relatively decreased complexity thereby generating syntax elements. Ideally (e.g., assuming no non-recoverable errors, deleterious effects, etc.), the syntax elements which are generated in accordance with CAVLC entropy decoding are identical to those syntax elements which have been generated in accordance with CAVLC entropy encoding.

In accordance with the CABAC entropy decoding, the received CABAC bits undergo arithmetic decoding thereby generating the bins which subsequently undergo variable length bin decoding of relatively decreased complexity thereby generating syntax elements. Ideally (e.g., assuming no non-recoverable errors, deleterious effects, etc.), the syntax elements which are generated in accordance with CABAC entropy decoding are identical to those syntax elements which have been generated in accordance with CABAC entropy encoding.

As can be seen with respect to this diagram, while the variable length bin decoding of relatively decreased complexity, the arithmetic decoding employed in accordance with CABAC entropy decoding is not necessarily of relatively reduced complexity. That is to say, such arithmetic decoding in accordance with CABAC entropy encoding may be unchanged. As such, it may be understood that the overall compression of bits that are received in accordance with both CABAC and CAVLC entropy decoding will correspondingly be of a relatively decreased compression; consequently, the complexity of the variable length binarization and employed for both CABAC and CAVLC entropy decoding will correspondingly be relatively decreased as well.

As may properly be understood with respect to the various embodiments and/or diagrams presented herein, a great deal of flexibility is provided for a designer to implement various functional blocks and/or methods in a manner such that certain of those functional blocks and/or methods may be shared and commonly used in accordance with CABAC/CAVLC entropy encoding as well as within CABAC/CAVLC entropy decoding. Depending on a particular application, various trade-offs may be made between the complexity of the commonly shared functional blocks and/or methods and the non-shared functional blocks and/or methods in accordance with such CABAC and CAVLC entropy coding architectures and/or methods. For example, if a common or fixed compression is desired for CABAC coding, then a trade-off may be made between the complexity of the variable length binarization/variable length bin decoding and the corresponding arithmetic encoding/decoding functional blocks and/or methods. Alternatively, if an increased or decreased compression is desired for CABAC or CAVLC coding, then appropriately selected and modified variable length binarization/variable length bin decoding and corresponding arithmetic encoding/decoding functional blocks and/or methods may be implemented.

As may properly be understood, by employing certain commonly shared and commonly employed functional blocks and/or methods within a CABAC/CAVLC entropy coding architecture and/or method, savings in terms of circuitry, hardware, software, processing module(s), component(s), real estate, die size, and/or processing resource(s), etc. as many employed for supporting both CABAC and CAVLC coding.

FIG. 21, FIG. 22A, FIG. 22B, FIG. 23, FIG. 24A, and FIG. 24B illustrate various embodiments of methods performed in accordance with video coding (e.g., within one or more communication devices).

Figure 21:
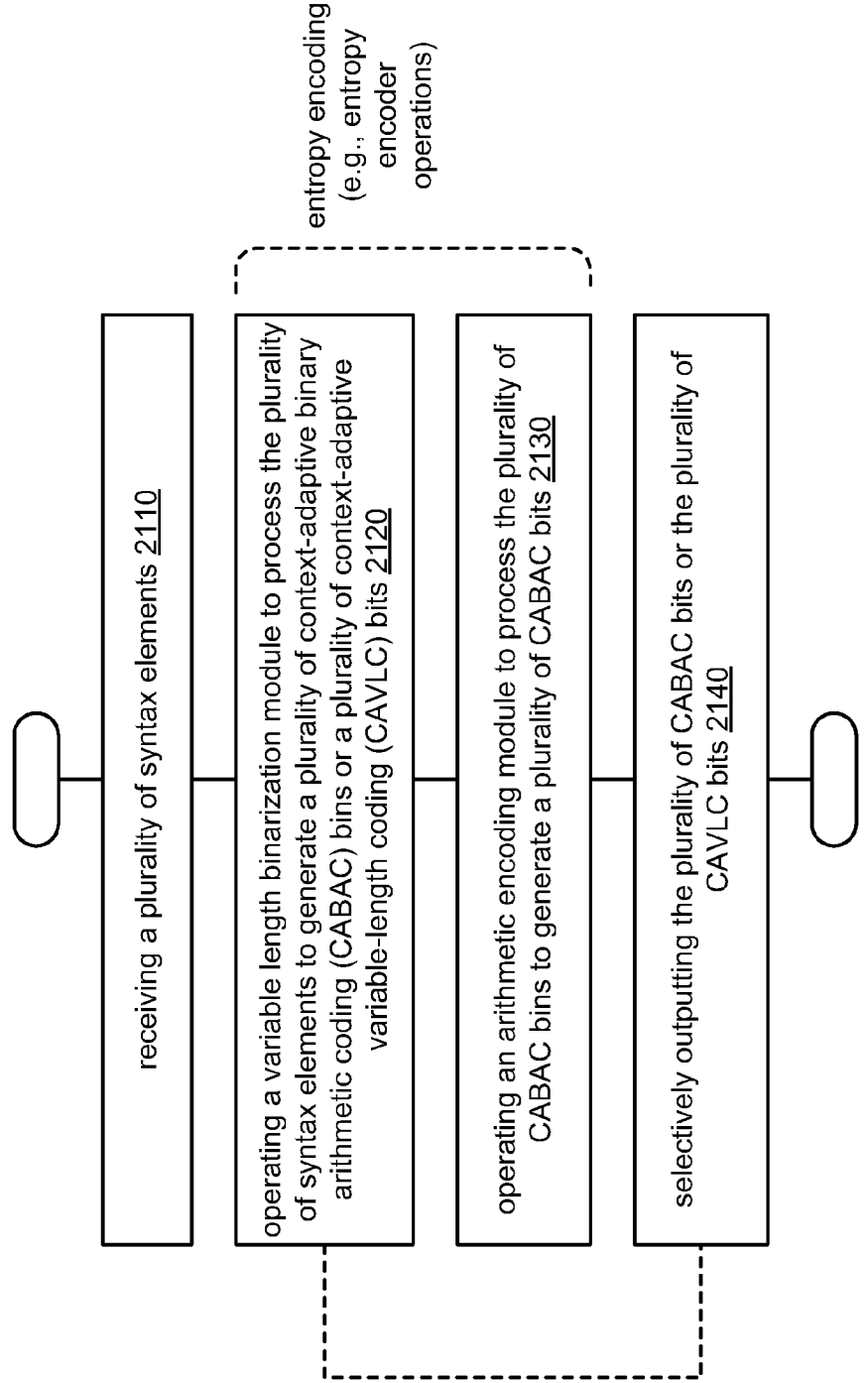
FIG. 21, FIG. 22A, FIG. 22B, FIG. 23, FIG. 24A, and FIG. 24B illustrate various embodiments of methods performed in accordance with video coding (e.g., within one or more communication devices).

Referring to method 2100 of FIG. 21, the method 2100 begins by receiving a plurality of syntax elements, as shown in a block 2110. The method 2100 continues by operating a variable length binarization module to process the plurality of syntax elements to generate a plurality of context-adaptive binary arithmetic coding (CABAC) bins or a plurality of context-adaptive variable-length coding (CAVLC) bits, as shown in a block 2120.

The method 2100 then operates by operating an arithmetic encoding module to process the plurality of CABAC bins to generate a plurality of CABAC bits, as shown in a block 2130. From certain perspectives and with respect to certain embodiments, the operations of the blocks 2120 and 2130 may be viewed as corresponding to entropy encoding (e.g., such as being performed in accordance with entropy encoder operations). The method 2100 continues by selectively outputting the plurality of CABAC bits or the plurality of CAVLC bits, as shown in a block 2140.

Figure 22B:
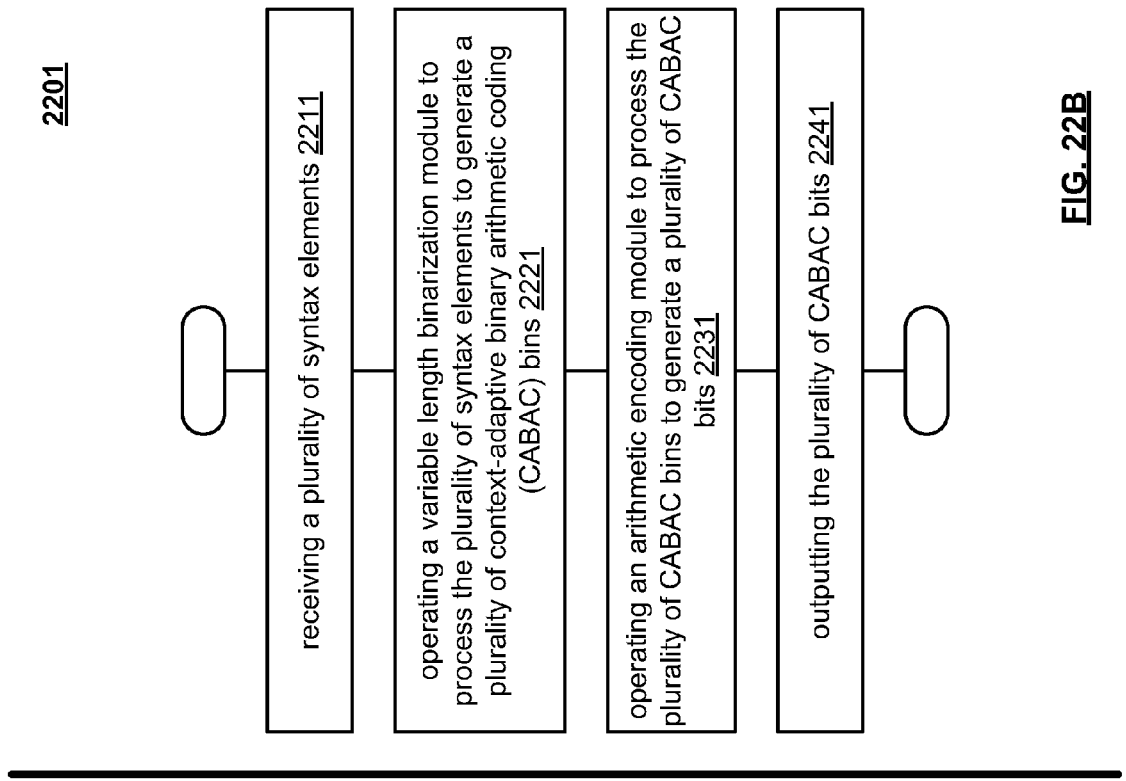
Figure 22A:
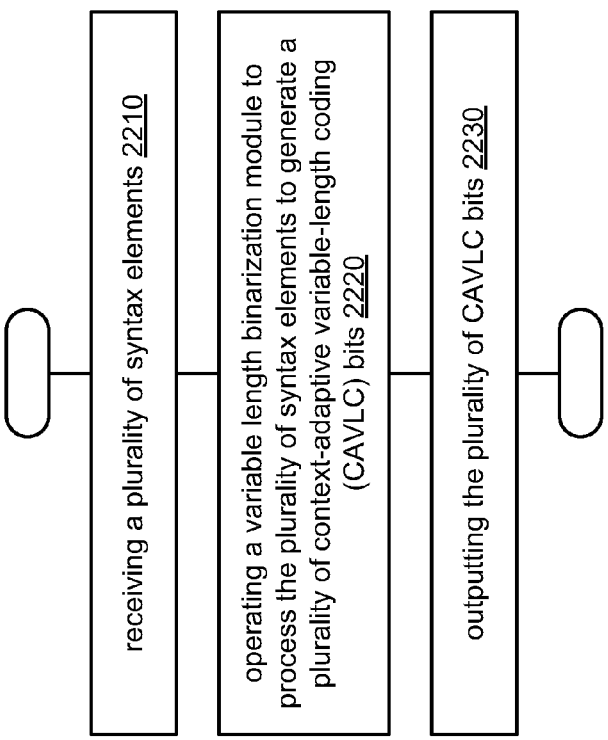

Referring to method 2200 of FIG. 22A, the method 2200 begins by receiving a plurality of syntax elements, as shown in a block 2210. The method 2200 continues by operating a variable length binarization module to process the plurality of syntax elements to generate a plurality of context-adaptive variable-length coding (CAVLC) bits, as shown in a block 2220. The method 2200 then operates by outputting the plurality of CAVLC bits, as shown in a block 2230.

Referring to method 2201 of FIG. 22B, the method 2201 begins by receiving a plurality of syntax elements, as shown in a block 2211. The method 2201 then operates by operating a variable length binarization module to process the plurality of syntax elements to generate a plurality of context-adaptive binary arithmetic coding (CABAC) bins, as shown in a block 2221. The method 2201 continues by operating an arithmetic encoding module to process the plurality of CABAC bins to generate a plurality of CABAC bits, as shown in a block 2231. The method 2201 then operates by outputting the plurality of CABAC bits, as shown in a block 2241.

Figure 23:
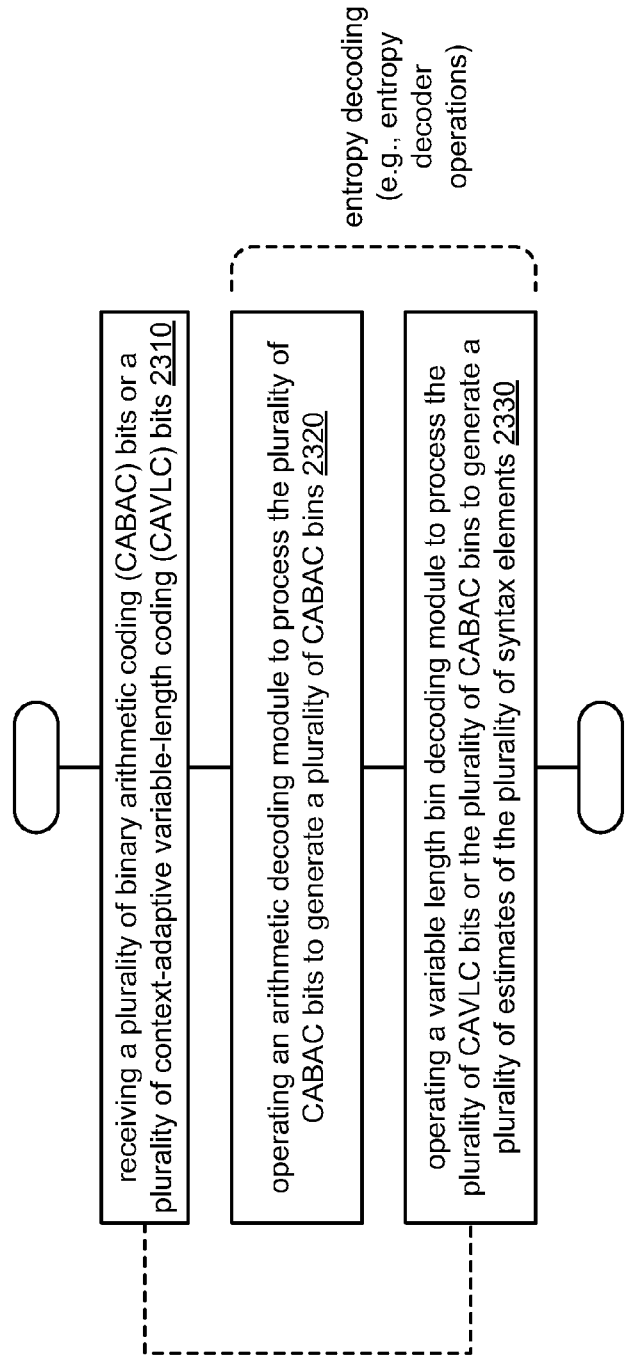

Referring to method 2300 of FIG. 23, the method 2300 begins by receiving a plurality of binary arithmetic coding (CABAC) bits or a plurality of context-adaptive variable-length coding (CAVLC) bits, as shown in a block 2310. The method 2300 continues by operating an arithmetic decoding module to process the plurality of CABAC bits to generate a plurality of CABAC bins, as shown in a block 2320.

The method 2300 then operates by operating a variable length bin decoding module to process the plurality of CAVLC bits or the plurality of CABAC bins to generate a plurality of estimates of the plurality of syntax elements, as shown in a block 2330. From certain perspectives and with respect to certain embodiments, the operations of the blocks 2320 and 2330 may be viewed as corresponding to entropy decoding (e.g., such as being performed in accordance with entropy decoder operations).

Figure 24B:
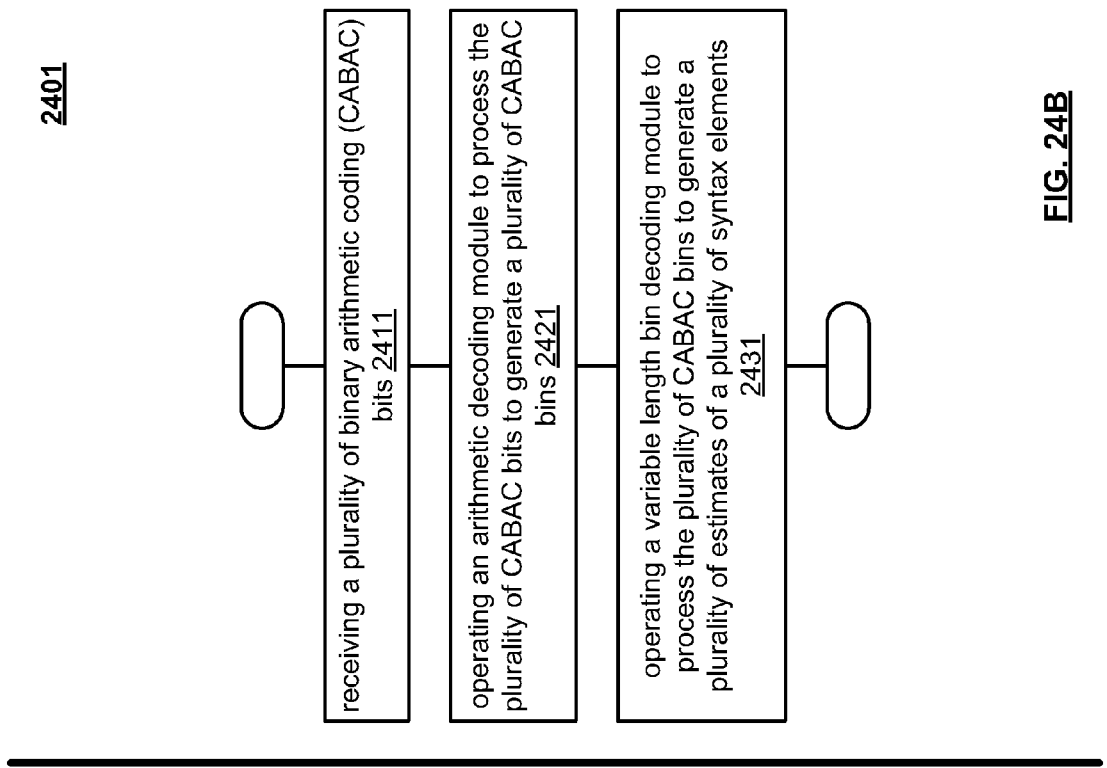
Figure 24A:
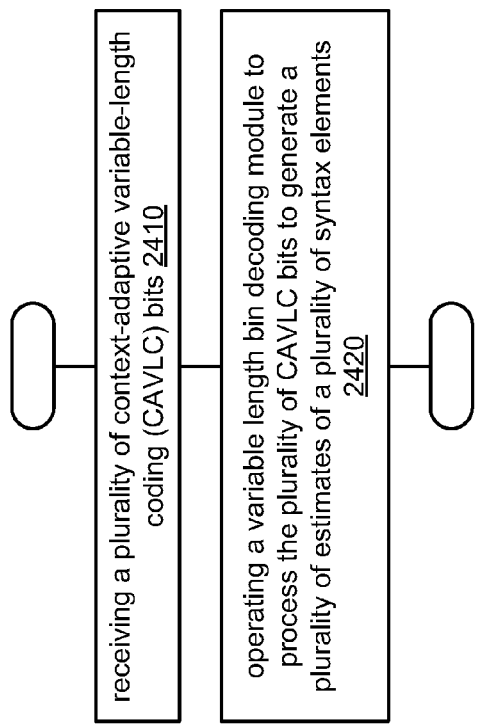

Referring to method 2400 of FIG. 24A, the method 2400 begins by receiving a plurality of context-adaptive variable-length coding (CAVLC) bits, as shown in a block 2410. The method 2400 continues by operating a variable length bin decoding module to process the plurality of CAVLC bits to generate a plurality of estimates of a plurality of syntax elements, as shown in a block 2420.

Referring to method 2401 of FIG. 24B, the method 2401 begins by receiving a plurality of binary arithmetic coding (CABAC) bits, as shown in a block 2411. The method 2401 then operates by operating an arithmetic decoding module to process the plurality of CABAC bits to generate a plurality of CABAC bins, as shown in a block 2421. The method 2401 continues by operating a variable length bin decoding module to process the plurality of CABAC bins to generate a plurality of estimates of a plurality of syntax elements, as shown in a block 2431.

It is also noted that the various operations and functions as described with respect to various methods herein may be performed within a communication device, such as using a baseband processing module and/or a processing module implemented therein and/or other component(s) therein.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise.

Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" (e.g., including various modules and/or circuitries such as may be operative, implemented, and/or for encoding, for decoding, for baseband processing, etc.) may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory (ROM), random access memory (RAM), volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. An apparatus comprising:
   an input configured to receive a plurality of syntax elements;
   an entropy encoder configured to perform entropy encoding adaptively based on a plurality of complexity operational modes including to perform entropy encoding based on a first of the plurality of complexity operational modes at or during a first time and to perform entropy encoding based on a second of the plurality of complexity operational modes at or during a second time, wherein the second of the plurality of complexity operational modes is less complex than the first of the plurality of complexity operational modes, wherein the entropy encoder including:
      a variable length binarization module configured to process the plurality of syntax elements to generate a plurality of context-adaptive binary arithmetic coding (CABAC) bins based on the first of the plurality of complexity operational modes and a plurality of context-adaptive variable-length coding (CAVLC) bits based on the second of the plurality of complexity operational modes; and
      an arithmetic encoding module configured to process the plurality of CABAC bins to generate a plurality of CABAC bits based on the first of the plurality of complexity operational modes; and
   at least one output configured to output the CABAC bits based on the first of the plurality of complexity operational modes and to output the CAVLC bits based on the second of the plurality of complexity operational modes.

2. The apparatus of claim 1, wherein the plurality of CABAC bins being the plurality of CAVLC bits.

3. The apparatus of claim 1 further comprising:
   a computer, a laptop computer, a high definition (HD) television, a standard definition (SD) television, a handheld media unit, a set top box (STB), or a digital video disc (DVD) player.

4. The apparatus of claim 1, wherein the apparatus is a first communication device; and further comprising:
   a second communication device, in communication with the first communication device via at least one communication channel, including:
      at least one additional input configured to receive the plurality of CABAC bits or the plurality of CAVLC bits; and
      an entropy decoder including:
         an arithmetic decoding module configured to process the plurality of CABAC bits to generate a plurality of estimates of the plurality of CABAC bins based on the first of the plurality of complexity operational modes; and
         a variable length bin decoding module configured to process the plurality of CAVLC bits based on the second of the plurality of complexity operational modes and the plurality of CABAC bins based on the first of the plurality of complexity operational modes to generate a plurality of estimates of the plurality of syntax elements, wherein the second communication device is at least one of computer, a laptop computer, a high definition (HD) television, a standard definition (SD) television, a handheld media unit, a set top box (STB), a digital video disc (DVD) player.

5. The apparatus of claim 1 further comprising:
   a communication device that is operative within at least one of a satellite communication system, a wireless communication system, a wired communication system, a fiber-optic communication system, or a mobile communication system.

6. An apparatus comprising:
   an entropy encoder configured to perform entropy encoding based on a first complexity operational mode of a plurality of complexity operational modes and to perform entropy encoding based on a second complexity operational mode of the plurality of complexity operational modes, wherein the second of the plurality of complexity operational modes is less complex than the first of the plurality of complexity operational modes, wherein the entropy encoder including:
  a variable length binarization module configured to process a plurality of syntax elements to generate a plurality of context-adaptive binary arithmetic coding (CABAC) bins based on the first complexity operational mode and a plurality of context-adaptive variable-length coding (CAVLC) bits based on the second complexity operational mode; and
  an arithmetic encoding module configured to process the plurality of CABAC bins to generate a plurality of CABAC bits based on the first complexity operational mode.

7. The apparatus of claim 6, wherein the plurality of CABAC bins being the plurality of CAVLC bits.

8. The apparatus of claim 6, wherein the entropy encoder is further configured to:
  perform entropy encoding adaptively based on any of the plurality of complexity operational modes.

9. The apparatus of claim 6, wherein the entropy encoder is further configured to:
  perform entropy encoding based on the first complexity operational mode at or during a first time; and
  perform entropy encoding based on the second complexity operational mode at or during a second time.

10. The apparatus of claim 6, wherein the apparatus is further configured to:
  output the CABAC bits when the entropy encoder operates based on the first complexity operational mode; and
  output the CAVLC bits when the entropy encoder operates based on the second complexity operational mode.

11. The apparatus of claim 6 further comprising:
  at least one input configured to receive at least one of the plurality of CABAC bits or the plurality of CAVLC bits; and
  an entropy decoder including:
    an arithmetic decoding module configured to process the plurality of CABAC bits to generate a plurality of estimates of the plurality of CABAC bins based on the first complexity operational mode; and
    a variable length bin decoding module configured to process the plurality of CAVLC bits based on the second complexity operational mode and the plurality of CABAC bins based on the first complexity operational mode to generate a plurality of estimates of the plurality of syntax elements.

12. The apparatus of claim 6, wherein the apparatus is a first communication device; and further comprising:
  a second communication device, in communication with the first communication device via at least one communication channel, including:
    at least one additional input configured to receive the plurality of CABAC bits or the plurality of CAVLC bits; and
    an entropy decoder including:
      an arithmetic decoding module configured to process the plurality of CABAC bits to generate a plurality of estimates of the plurality of CABAC bins; and
      a variable length bin decoding module configured to process the plurality of CAVLC bits based on the second complexity operational mode and the plurality of CABAC bins based on the first complexity operational mode to generate a plurality of estimates of the plurality of syntax elements, wherein the second communication device is at least one of computer, a laptop computer, a high definition (HD) television, a standard definition (SD) television, a handheld media unit, a set top box (STB), or a digital video disc (DVD) player.

13. The apparatus of claim 6 further comprising:
  a communication device that is operative within at least one of a satellite communication system, a wireless communication system, a wired communication system, a fiber-optic communication system, or a mobile communication system.

14. A method for execution by an entropy encoder of a communication device, the method comprising:
  operating the entropy encoder to perform entropy encoding based on a first complexity operational mode of a plurality of complexity operational modes and performing entropy encoding based on a second complexity operational mode of the plurality of complexity operational modes, wherein the second of the plurality of complexity operational modes is less complex than the first of the plurality of complexity operational modes;
  operating a variable length binarization module of the entropy encoder to process a plurality of syntax elements to generate a plurality of context-adaptive binary arithmetic coding (CABAC) bins based on a first complexity operational mode of a plurality of complexity operational modes and a plurality of context-adaptive variable-length coding (CAVLC) bits based on a second complexity operational mode of the plurality of complexity operational modes; and
  operating an arithmetic encoding module of the entropy encoder to process the plurality of CABAC bins to generate a plurality of CABAC bits based on the first complexity operational mode.

15. The method of claim 14, wherein the plurality of CABAC bins being the plurality of CAVLC bits.

16. The method of claim 14 further comprising:
  operating the entropy encoder to perform entropy encoding adaptively based on any of the plurality of complexity operational modes.

17. The method of claim 14 further comprising:
  operating the entropy encoder to perform entropy encoding based on the first complexity operational mode at or during a first time; and
  operating the entropy encoder to perform entropy encoding based on the second complexity operational mode at or during a second time.

18. The method of claim 14 further comprising:
  outputting to output the CABAC bits when the entropy encoder operative operates based on the first complexity operational mode; and
  outputting the CAVLC bits when the entropy encoder operative operates based on the second complexity operational mode, wherein the second complexity operational mode is less complex than the first complexity operational mode.

19. The method of claim 14 further comprising:
  operating an additional communication device, in communication with the communication device via at least one communication channel, by:
  receiving the plurality of CABAC bits or the plurality of CAVLC bits;
  operating an arithmetic decoding module to process the plurality of CABAC bits to generate a plurality of estimates of the plurality of CABAC bins; and
  operating a variable length bin decoding module to process the plurality of CAVLC bits based on the second complexity operational mode and the plurality of CABAC bins based on the first complexity operational mode to generate a plurality of estimates of the plurality of syntax elements, wherein the additional communication device is at least one of computer, a laptop computer, a high definition (HD) television, a standard definition (SD) television, a handheld media unit, a set top box (STB), or a digital video disc (DVD) player.

20. The method of claim 14, wherein the communication device is operative within at least one of a satellite communication system, a wireless communication system, a wired communication system, a fiber-optic communication system, or a mobile communication system.

* * * * *